United States Patent
Yagami et al.

(10) Patent No.: US 9,264,631 B2
(45) Date of Patent: Feb. 16, 2016

(54) INFRARED CONVERSION DEVICE, IMAGING APPARATUS, AND IMAGING METHOD

(71) Applicant: Sony Corporation, Tokyo (JP)

(72) Inventors: Kojiro Yagami, Kanagawa (JP); Hideshi Abe, Kanagawa (JP); Tatsushiro Hirata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/394,658

(22) PCT Filed: Apr. 17, 2013

(86) PCT No.: PCT/JP2013/061365
§ 371 (c)(1),
(2) Date: Oct. 15, 2014

(87) PCT Pub. No.: WO2013/168522
PCT Pub. Date: Nov. 14, 2013

(65) Prior Publication Data
US 2015/0069237 A1    Mar. 12, 2015

(30) Foreign Application Priority Data

May 8, 2012  (JP) ................. 2012-106477

(51) Int. Cl.
| | | |
|---|---|---|
| H01L 25/00 | (2006.01) | |
| H04N 5/33 | (2006.01) | |
| G02F 1/35 | (2006.01) | |

(Continued)

(52) U.S. Cl.
CPC ... *H04N 5/33* (2013.01); *G01J 5/00* (2013.01); *G01J 5/046* (2013.01); *G01J 5/0853* (2013.01); *G01J 5/58* (2013.01); *G02F 1/353* (2013.01); *H01L 27/14649* (2013.01);

(Continued)

(58) Field of Classification Search
CPC ........... G01J 5/0853; G01J 2005/0077; G02F 2202/36; G02F 2203/11; H01L 27/14649
See application file for complete search history.

(56) References Cited

U.S. PATENT DOCUMENTS

| | | | | |
|---|---|---|---|---|
| 7,820,968 | B2 * | 10/2010 | Sakemoto et al. ............. | 250/330 |
| 2003/0133489 | A1 * | 7/2003 | Hirota et al. ................... | 374/121 |
| 2006/0266157 | A1 * | 11/2006 | Takata et al. .................... | 75/255 |

FOREIGN PATENT DOCUMENTS

| | | |
|---|---|---|
| JP | 05-273503 | 10/1993 |
| JP | 2008-055570 A | 3/2008 |

(Continued)

OTHER PUBLICATIONS

European Patent Office Communication Pursuant to Rule 164(1) EPC Partial Supplemental European Search for Application No. 13788449.0/1562/2848988.

Primary Examiner — Kiho Kim
(74) Attorney, Agent, or Firm — Michael Best & Friedrich LLP

(57) ABSTRACT

An infrared conversion device includes: a substrate (122); and a metal fine particle layer (123) formed on the substrate (122), wherein the metal fine particle layer (123) is formed with metal fine particles (124) and a dielectric material (125) that fills gaps between the metal fine particles (124) and absorbs incident infrared rays. Alternatively, an infrared conversion device detects infrared rays converted into visible light by detecting a change caused in the permittivity of a light receiving material (125) by infrared absorption as a change in the intensity of scattering light based on local plasmon resonance.

14 Claims, 21 Drawing Sheets

(51) Int. Cl.
*H04N 17/00* (2006.01)
*G01J 5/04* (2006.01)
*G01J 5/58* (2006.01)
*G01J 5/08* (2006.01)
*H01L 27/146* (2006.01)
*G01J 5/00* (2006.01)

(52) U.S. Cl.
CPC ...... *H04N 17/002* (2013.01); *G01J 2005/0077* (2013.01); *G02F 2202/36* (2013.01); *G02F 2203/11* (2013.01)

(56) References Cited

FOREIGN PATENT DOCUMENTS

| | | |
|---|---|---|
| JP | 2009-042164 | 2/2009 |
| JP | 2010-016733 A | 1/2010 |
| JP | 2011-138067 A | 7/2011 |
| KR | 2011-0054111 A | 5/2011 |

\* cited by examiner

WIRE MATERIAL

INFRARED CONVERSION DEVICE, IMAGING APPARATUS, AND IMAGING METHOD

TECHNICAL FIELD

The present disclosure relates to infrared conversion devices, imaging apparatuses, and imaging methods.

BACKGROUND ART

In recent years, there has been a dramatically increasing demand for infrared cameras not only for temperature measurement but also for security purposes. Examples of known infrared cameras include quantum-type infrared cameras and bolometer-type infrared cameras. A quantum-type infrared camera normally requires cooling so as to cope with thermal noise, and therefore, the infrared camera becomes larger in size and more expensive. A bolometer-type infrared camera that detects resistance changes due to heat also requires cooling by a Peltier device in practice, and further requires a large-capacity memory for periodic calibration of each pixel. Moreover, such a bolometer-type infrared camera has a problem that images become discontinuous at the time of calibration. In addition to that, a bolometer-type infrared camera has the problems of being easily affected by background radiation, consuming a large amount of power, being expensive, being large in size, and being heavy.

To solve such problems, JP 2009-042164 A discloses an infrared camera using surface plasmon resonance phenomena, for example. Using a prism, this infrared camera detects a change in the permittivity of a dielectric film due to heat as a change in the metal surface plasmon resonance condition. Also, JP 5-273503 A discloses a spatial light modulator that uses surface plasmon resonance and is capable of high-efficiency light modulation without conversion of optical information to electrical information, or more specifically, a spatial light modulator formed with an optical wave coupler including a composite layer of a material having a refractive index that varies with light irradiation and a metal.

CITATION LIST

Patent Document

Patent Document 1: JP 2009-042164 A
Patent Document 2: JP 5-273503 A

SUMMARY OF THE INVENTION

Problems to be Solved by the Invention

The technologies disclosed in those laid-open patent publications are technologies based on surface plasmon resonance. Propagating in metal surfaces, surface plasmon has low spatial resolution, and requires an extensive and precise optical mechanism including a prism.

In view of the above, the present disclosure aims to provide infrared conversion devices that have high spatial resolution and have simple configurations and structures, and imaging apparatuses into which such infrared conversion devices are incorporated, and imaging methods.

Solutions to Problems

An infrared conversion device according to a first embodiment of the present disclosure to achieve the above object includes a substrate and a metal fine particle layer formed on the substrate, and the metal fine particle layer is formed with metal fine particles and a dielectric material that fills gaps between the metal fine particles and absorbs incident infrared rays.

An infrared conversion device according to a second embodiment of the present disclosure to achieve the above object includes a metal fine particle layer formed with metal fine particles and a dielectric material that fills gaps between the metal fine particles and absorbs incident infrared rays.

An infrared conversion device according to a third embodiment of the present disclosure to achieve the above object includes: a dielectric film that is formed with a dielectric material and absorbs infrared rays entering from a first surface thereof; and metal fine particles placed on a second surface of the dielectric film, the second surface being on the opposite side from the first surface.

An infrared conversion device according to a fourth embodiment of the present disclosure to achieve the above object is an infrared conversion device that detects infrared rays converted into visible light by detecting a change caused in the permittivity of a light receiving material by infrared absorption as a change in the intensity of scattering light based on local plasmon resonance.

An imaging apparatus according to the first embodiment of the present disclosure to achieve the above object includes:

(A) an infrared conversion device array unit formed by arranging infrared conversion devices in a two-dimensional matrix fashion, each of the infrared conversion devices including a substrate and a metal fine particle layer formed on the substrate, the metal fine particle layer including metal fine particles and a dielectric material that fills gaps between the metal fine particles and absorbs incident infrared rays;

(B) a light source that emits reference light to the infrared conversion device array unit; and (C) an imaging device array unit located on the opposite side of the infrared conversion device array unit from the infrared incidence side.

An imaging apparatus according to the second embodiment of the present disclosure to achieve the above object includes:

(A) an infrared conversion device array unit formed by arranging infrared conversion devices in a two-dimensional matrix fashion, each of the infrared conversion devices including a metal fine particle layer, the metal fine particle layer including metal fine particles and a dielectric material that fills gaps between the metal fine particles and absorbs incident infrared rays;

(B) a light source that emits reference light to the infrared conversion device array unit; and (C) an imaging device array unit located on the opposite side of the infrared conversion device array unit from the infrared incidence side.

An imaging apparatus according to the third embodiment of the present disclosure to achieve the above object includes:

(A) an infrared conversion device array unit formed by arranging infrared conversion devices in a two-dimensional matrix fashion, each of the infrared conversion devices including a dielectric film and metal fine particles, the dielectric film being formed with a dielectric material and absorbing infrared rays entering from a first surface thereof, the metal fine particles being placed on a second surface of the dielectric film, the second surface being on the opposite side from the first surface;

(B) a light source that emits reference light to the infrared conversion device array unit; and (C) an imaging device array unit located on the opposite side of the infrared conversion device array unit from the infrared incidence side.

An imaging apparatus according to the fourth embodiment of the present disclosure to achieve the above object includes:

(A) an infrared conversion device array unit formed by arranging infrared conversion devices in a two-dimensional matrix fashion, each of the infrared conversion devices detecting infrared rays converted into visible light by detecting a change caused in the permittivity of a light receiving material by infrared absorption as a change in the intensity of scattering light based on local plasmon resonance;

(B) a light source that emits reference light to the infrared conversion device array unit; and (C) an imaging device array unit located on the opposite side of the infrared conversion device array unit from the infrared incidence side.

An imaging method according to the first embodiment of the present disclosure to achieve the above object is an imaging method using the above described imaging apparatus according to the first embodiment of the present disclosure. An imaging method according to the second embodiment of the present disclosure to achieve the above object is an imaging method using the above described imaging apparatus according to the second embodiment of the present disclosure. An imaging method according to the third embodiment of the present disclosure to achieve the above object is an imaging method that uses the above described imaging apparatus according to the third embodiment of the present disclosure, and includes detecting a decrease caused in the intensity of scattering light due to a change in a local plasmon resonance state formed in the metal fine particles by irradiation of the metal fine particles with the reference light, since the permittivity of the dielectric material changes due to infrared absorption, the detecting being performed by the imaging device array unit.

An imaging method according to the fourth embodiment of the present disclosure to achieve the above object is an imaging method that uses the above described imaging apparatus according to the fourth embodiment of the present disclosure, and includes detecting a decrease caused in the intensity of scattering light due to a change in a local plasmon resonance state formed in the light receiving material by irradiation of the light receiving material with the reference light, since the permittivity of the light receiving material changes due to infrared absorption, the detecting being performed by the imaging device array unit.

Effects of the Invention

In the infrared conversion devices, the imaging apparatuses, and the imaging methods according to the first through fourth embodiments of the present disclosure, there is no need to cool the infrared conversion devices, and infrared rays (heat rays) that are solely optically, not electrically, subjected to spatial light modulation can be detected. Accordingly, it is possible to provide infrared conversion devices that have high spatial resolution and can detect small temperature differences in spite of its simple configuration and structure. It is also possible to provide small-sized, lightweight, power-saving, and inexpensive imaging apparatuses having the above infrared conversion devices incorporated thereinto, and imaging methods using the imaging apparatuses.

MODES FOR CARRYING OUT THE INVENTION

Figure 1:
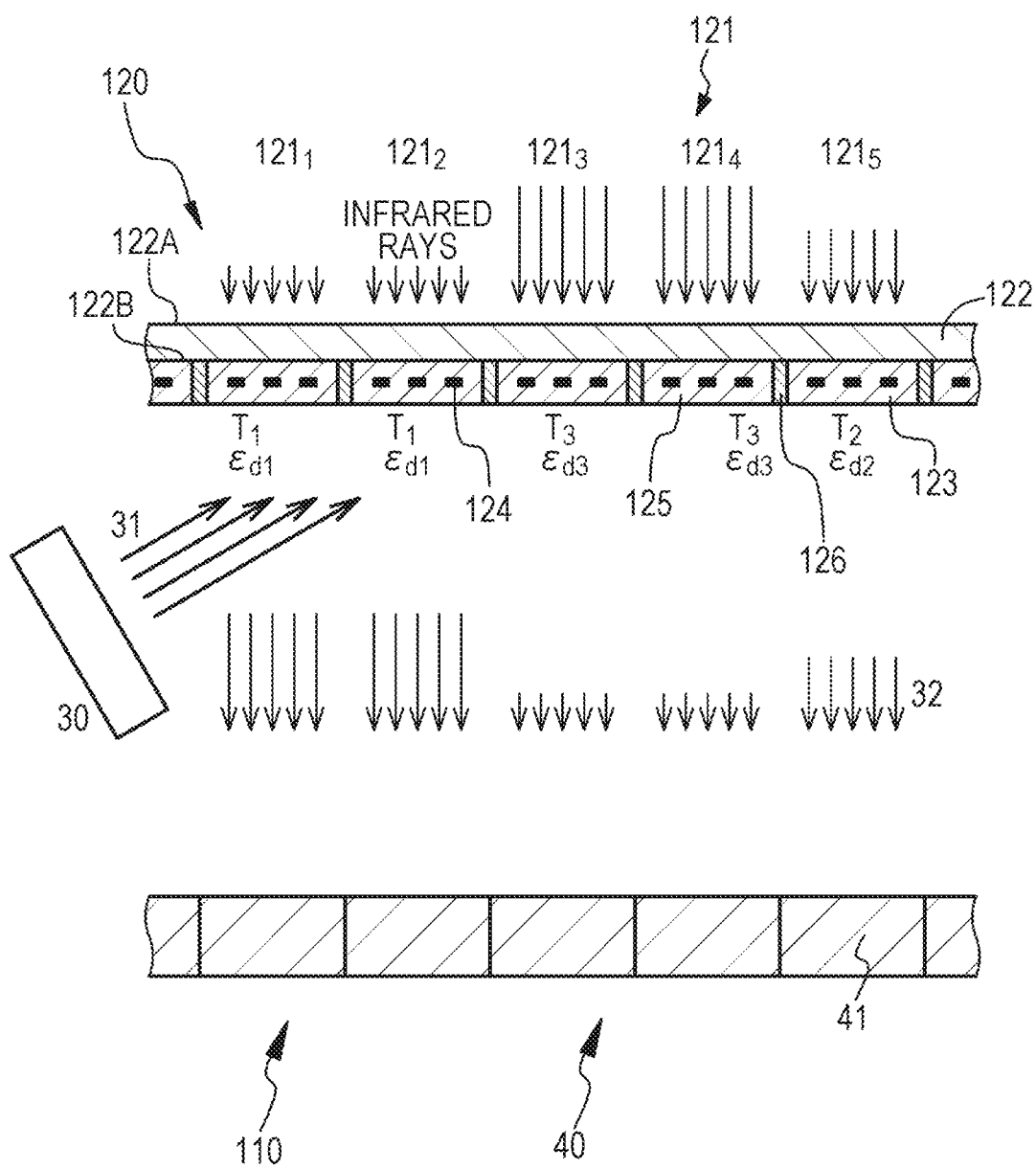
FIG. 1 is a conceptual diagram of an imaging apparatus of Example 1.

The following is a description of the present disclosure based on embodiments, with reference to the drawings. However, the present disclosure is not limited to the embodiments, and the various numerical values and materials mentioned in the embodiments are merely examples. Explanation will be made in the following order.

1. Description of infrared conversion devices, imaging apparatuses, and imaging methods according to first through fourth embodiments of the present disclosure
2. Example 1 (infrared conversion devices, imaging apparatuses, and imaging methods according to the first and fourth embodiments of the present disclosure)

3. Example 2 (a modification of Example 1)
4. Example 3 (a modification of Examples 1 and 2)
5. Example 4 (a modification of Examples 1 through 3)
6. Example 5 (a modification of Examples 1 through 4)
7. Example 6 (a modification of Example 5)
8. Example 7 (infrared conversion devices, imaging apparatuses, and imaging methods according to the second and fourth embodiments of the present disclosure)
9. Example 8 (infrared conversion devices, imaging apparatuses, and imaging methods according to the third and fourth embodiments of the present disclosure)

In the infrared conversion devices, the imaging apparatuses, and the imaging methods according to the first through third embodiments of the present disclosure, scattering light may be generated based on local plasmon resonance caused in the metal fine particles by irradiation of the metal fine particles with the reference light. In this case, the local plasmon resonance state in the metal fine particles may be changed due to a change caused in the permittivity of the dielectric material by infrared absorption, and the intensity of scattering light may become lower due to the change in the local plasmon resonance state.

In the infrared conversion devices, the imaging apparatuses, and the imaging methods according to the first through fourth embodiments of the present disclosure including the above described preferred embodiments, the reference light is visible light, and the frequency or the angular frequency of scattering light is equal to the frequency or the angular frequency of the reference light. In this case, the wavelength of the reference light may be variable, or a wavelength selector that selects a wavelength of the reference light may be provided between the light source and the infrared conversion device array unit. With this structure, the local plasmon resonance condition can be readily calibrated.

In the infrared conversion devices, the imaging apparatuses, and the imaging methods according to the first through third embodiments of the present disclosure including the above described preferred embodiments and configurations, the metal fine particles may be regularly arranged.

In the imaging apparatuses and the imaging methods according to the first through fourth embodiments of the present disclosure including the above described preferred embodiments and configurations, a light blocking mechanism for calibrating detection of the intensity of scattering light may be provided. In this case, the light blocking mechanism may be formed with a shutter mechanism that controls infrared rays incident on the dielectric material or the light receiving material. Alternatively, the infrared conversion device array unit may include an infrared detection region and a calibration region for calibrating detection of the intensity of scattering light. In this case, a light blocking film that prevents incidence of infrared rays may be formed in the calibration region, and a light blocking member may be provided in a boundary region between the infrared detection region and the calibration region.

Further, in the imaging apparatuses and the imaging methods according to the first through fourth embodiments of the present disclosure including the above described preferred embodiments and configurations, a reflective member that reflects scattering light toward the metal fine particle layer or the light receiving material may be provided on the infrared incidence side of each infrared conversion device.

Further, in the imaging apparatuses and the imaging methods according to the first through fourth embodiments of the present disclosure including the above described preferred embodiments and configurations, a microlens may be provided on the infrared incidence side of each infrared conversion device.

In the description below, the infrared conversion devices according to the first embodiment of the present disclosure, the infrared conversion devices forming the imaging apparatus according to the first embodiment of the present disclosure, and the infrared conversion devices in the imaging method according to the first embodiment of the present disclosure will be also referred to as "the infrared conversion devices and the like according to the first embodiment of the present disclosure". The infrared conversion devices according to the second embodiment of the present disclosure, the infrared conversion devices forming the imaging apparatus according to the second embodiment of the present disclosure, and the infrared conversion devices in the imaging method according to the second embodiment of the present disclosure will be also referred to as "the infrared conversion devices and the like according to the second embodiment of the present disclosure". The infrared conversion devices according to the third embodiment of the present disclosure, the infrared conversion devices forming the imaging apparatus according to the third embodiment of the present disclosure, and the infrared conversion devices in the imaging method according to the third embodiment of the present disclosure will be also referred to as "the infrared conversion devices and the like according to the third embodiment of the present disclosure". The infrared conversion devices according to the first through fourth embodiments of the present disclosure, the imaging apparatuses according to the first through fourth embodiments of the present disclosure, and the imaging methods according to the first through fourth embodiments of the present disclosure will be also referred to simply as "the present disclosure".

Local plasmon resonance (also called localized surface plasmon resonance) in the present disclosure is a phenomenon where a bias of charge appears in the surfaces of metal fine particles or an electric dipole field is generated when light enters the surfaces of the metal fine particles, and the electric dipole field absorbs incident light by resonating and oscillating with the incident light. In this case, near-field light (an enhanced electric field) and scattering light (radiated light) are generated. Here, the near-field light (an enhanced electric field) is an oscillating electric field not electromagnetic waves. The light absorption wavelength is a function of the permittivity or the refractive index of the substance surrounding the metal fine particles. There is no dispersion relationship between ω and k, and the function can be regarded as a straight line, with ω being constant.

Local plasmon resonance is a different phenomenon from surface plasmon resonance (also called propagating surface plasmon resonance). In surface plasmon resonance, plane waves that propagate along an interface are generated. Surface plasmon resonance is not caused simply by light irradiation, and it is necessary to take an appropriate measure to couple incident light with surface plasmon (by forming a minute periodic structure in the surface, preparing a high-refractive-index material such as a prism, or converting incident light into evanescent waves through total reflection, for example). Also, in surface plasmon resonance, the dispersion relationship between angular frequency ω and wave number k (an interface-direction component) is nonlinear, incident light and frequency are constant, and there is a decrease in wavelength or a decrease in speed.

The condition for local plasmon resonance can be ideally expressed as $\in_m + 2\in_d = 0$, where $\in_m$ represents the permittivity of the metal fine particles, and $\in_d$ represents the permittivity of the substance surrounding the metal fine particles. In the infrared conversion devices and the like according to the first embodiment of the present disclosure or the infrared conversion devices and the like according to the second embodiment of the present disclosure, the substance surrounding the metal fine particles is the dielectric material that fills gaps between the metal fine particles. In the infrared conversion devices and the like according to the third embodiment of the present disclosure, the substance surrounding the metal fine particles is the air or vacuum. Where the local plasmon resonance condition is satisfied, incident light is efficiently absorbed by the metal fine particles, and is converted into scattering light. In this aspect, heat loss in the metal fine particles can be reduced by appropriately designing the metal fine particles so that each metal fine particle has a large scattering cross section and has a small absorption cross section. In a non-resonant state, the metal fine particles absorb only a small proportion of the reference light, and most of the reference light pass through the metal fine particles or are reflected by an interface, resulting in dissipation.

In the infrared conversion devices and the like according to the first embodiment of the present disclosure, the relationships among the substrate, the metal fine particle layer, incident infrared rays, the light source, and the imaging device array unit are as follows.

(Case 1) Infrared rays enter from a first surface of the substrate, the metal fine particle layer is formed on a second surface on the opposite side of the substrate from the first surface, and the imaging device array unit and the light source are located on the side of the second surface of the substrate.

(Case 2) Infrared rays enter from the first surface of the substrate, the metal fine particle layer is formed on the second surface on the opposite side of the substrate from the first surface, the imaging device array unit is located on the side of the second surface of the substrate, and the light source is located on the side of the first surface of the substrate.

(Case 3) Infrared rays enter from the first surface of the substrate, the metal fine particle layer is formed on the first surface of the substrate, and the imaging device array unit and the light source are located on the side of the second surface of the substrate.

(Case 4) Infrared rays enter from the first surface of the substrate, the metal fine particle layer is formed on the first surface of the substrate, the imaging device array unit is located on the side of the second surface of the substrate, and the light source is located on the side of the first surface of the substrate.

In (Case 1) of the infrared conversion devices and the like according to the first embodiment of the present disclosure, the substrate is transparent to infrared rays in the neighborhood of 10 μm in wavelength, and may absorb the reference light. Examples of materials that can form the substrate include materials having a high transmittance for infrared rays of about 10 μm in wavelength (such as germanium (Ge) and ZnGe), semiconductor materials with wide bandgaps, polyethylene resins, glass materials, ceramic materials, and the like. In a case where the substrate is made of a crystalline material, the crystalline material is preferably a monocrystalline material, and is preferably as thin as possible while enough strength is maintained. In (case 2), the substrate is transparent to infrared rays of about 10 μm in wavelength and reference light of approximately 400 to 550 nm in wavelength, and examples of materials that can form the substrate include glass materials, ceramic materials, and the like. In a case where the substrate is made of a crystalline material, the crystalline material is preferably a monocrystalline material, and is preferably as thin as possible while enough strength is maintained. In (Case 3) and (Case 4), the substrate is transparent to reference light of approximately 400 to 550 nm in wavelength, and may absorb incident rays. Examples of materials that can form the substrate include materials having a high transmittance for light of approximately 400 to 550 nm in wavelength (such as glass materials and quartz), semiconductor materials with wide bandgaps, insulating materials, organic materials, and the like. In a case where the substrate is made of a crystalline material, the crystalline material is preferably a monocrystalline material, and is preferably as thin as possible while enough strength is maintained. The material forming the dielectric material in the infrared conversion devices and the like according to the first through third embodiments of the present disclosure is a material having a permittivity (a refractive index) that greatly varies with infrared absorption. Specific examples of such materials include Polyamide 66 (Leona (a registered trade name), for example), methacrylic resins such as PMMA resins, silicon nitrides ($SiN_X$), silicon oxides ($SiO_Y$), silicon oxynitrides (SiON), liquid crystal molecules, pigmented organic films (pigment gain mediums), thin film materials having quantum dots such as Si dispersed therein, materials used in infrared cutoff filters (materials that absorb infrared rays), photochromic materials, and the like. The dielectric material may have a single-layer structure or a multilayer structure, depending on the wavelength of infrared rays to be absorbed. In the infrared conversion devices and the like according to the first embodiment of the present disclosure, the material forming the substrate and the material forming the dielectric material may be the same or may be different. The thickness of the substrate may be $1\times10^{-7}$ m to $1\times10^{-6}$ m, for example, and the thickness of the dielectric material may be $1\times10^{-7}$ m to $1\times10^{-6}$ m, for example. The thicknesses of the substrate and the dielectric material may be adjusted and determined as appropriate in accordance with the heat capacities and infrared absorbances of the substrate and the dielectric material. The dielectric material has a permittivity (a refractive index) that varies with infrared absorption, and can be formed with a material that does not necessarily have temperature changes (such as one of the above mentioned photochromic materials).

Further, examples of materials that can form the metal fine particles in the infrared conversion devices and the like according to the first through third embodiments of the present disclosure include various metals and alloys that are used in local plasmon resonance, such as silver (Ag), gold (Au), aluminum (Al), and tungsten (W). So as to obtain regularly-arranged metal fine particles, a thin metal film is formed on the substrate, the dielectric material, or the dielectric film by physical vapor deposition (PVD) or chemical vapor deposition (CVD), and etching is then performed on the thin metal film by a photolithography technique or an etching technique. However, the present disclosure is not limited to such a method. To obtain the metal fine particle layer, the metal fine particles are formed on the dielectric material, and the metal fine particles are then coated with the dielectric material. That is, the metal fine particles are wrapped in the dielectric material. The metal fine particles may have a column-like shape (a cylindrical shape or a shape of a rectangular bar), a disk-like shape, a spherical shape, a hemispherical shape, or the like, and may be appropriately designed by taking into account facilitation of resonance and simplification of manufacturing procedures. The array pattern of the metal fine particles may be a regular two-dimensional array pattern, for example. More specific examples include a square, a regular triangle, a regular hexagon, and the like. With the two-dimensional periodic structure of the metal fine particles, the in-plane components of scattering light can be enclosed as standing waves in the two-dimensional array nanostructure, and leakage of scattering light into the infrared conversion devices in the neighborhood can be prevented. At the same time, resonance in the plane can be enhanced. The size of the metal fine particles depends on the metal material forming the metal fine particles, the substance surrounding the metal fine particles, the wavelength of the reference light, and the like, and is approximately on the order of several tens to several hundreds of nanometers. The intervals between the metal fine particles (the size of the two-dimensional periodic array of the metal fine particles) are appropriately determined by taking into account the wavelength of the reference light, the material forming the metal fine particles, and the substance surrounding the metal fine particles, so as to obtain an interaction from the scattering light between the metal fine particles in the plane. The nearest center-to-center distance between the metal fine particles is approximately on the same order as the wavelength of the reference light.

So as to increase spatial resolution in terms of heat, the metal fine particle layer and the light receiving material that absorb infrared rays are preferably physically divided into portions of appropriate pixel size. In the infrared conversion devices and the like according to the first embodiment of the present disclosure, the metal fine particle layer can be physically divided in accordance with a combination of a lithography technique and an etching technique in the field of semiconductor device manufacture, or a technology of manufacturing MEMS (Micro Electro Mechanical Systems). In the infrared conversion devices and the like according to the second embodiment of the present disclosure and the infrared conversion devices according to the third embodiment of the present disclosure, the metal fine particle layer or the dielectric film can be physically divided in accordance with a combination of a lithography technique and an etching technique in the field of semiconductor device manufacture, or a technology of manufacturing MEMS. The size of an infrared conversion device (the size of one pixel in the infrared conversion device array unit) is preferably almost the same as the wavelength of infrared rays to be detected, for example. With this size, heat propagation between the infrared conversion devices can be prevented, and furthermore, the spatial resolution of thermal images can be increased. The wavelength of infrared rays to be detected according to the present disclosure is approximately 1 µm or greater, and a typical detection wavelength is approximately 10 µm of infrared rays called heat rays. Making the infrared conversion devices too small is pointless, and too large infrared conversion devices reduce spatial resolution. The size of each infrared conversion device (the size of one pixel in the infrared conversion device array unit) may be the same as the size of an imaging device in the imaging device array unit (the size of one pixel in the imaging device array unit), or the latter may be smaller than the former.

A light emitting diode (LED) or a semiconductor laser device can be used as the light source that emits the reference light. The infrared conversion device array unit may be collectively irradiated (illuminated) with the reference light. That is, the entire surface of the infrared conversion device array unit may be collectively irradiated (illuminated) continuously in terms of time or with pulse-like reference light. Alternatively, the infrared conversion device array unit may be scanned and irradiated (illuminated) with beams of reference light. In this manner, scattering light intensity may be sequentially read. The wavelength of the reference light needs to be such a wavelength that the temperature of the dielectric material or the light receiving material does not rise at the time of reference light irradiation, and the light source of the reference light is preferably a single-color light source or a light source that has a continuous wavelength spectrum from blue to green and does not include longer wavelengths than the wavelength of red. Specifically, the wavelength of the reference light may be 400 to 550 nm, for example. With irradiation with the reference light of such a wavelength, the temperature of the dielectric material hardly rises. Even if the temperature of the dielectric material slightly rises, the temperature rise is eliminated as part of background radiation and does not affect signal detection, as long as the local plasmon resonance condition is calibrated as the initial state by taking into account such a temperature rise. So as to vary the wavelength of the reference light that is output from a single-color light source, an LED that can electrically and continuously change wavelength may be used, for example. A color filter may be used as a wavelength selector that selects a desired wavelength of the reference light that is emitted from a light source that has a continuous wavelength spectrum, for example. The color filter may be a rotative disk-like filter, for example, and may be designed to select a desired wavelength of passing reference light depending on the position with and through which the reference light from the light source collides and passes. In this manner, calibration can be performed to obtain the local plasmon resonance to be the initial state based on wavelength modulation of the reference light, and calibration can also be performed to cope with environmental temperature changes (background radiation). An infrared cut-off filter may be provided for the light source, or a bandpass filter of some kind that passes a desired wavelength may be provided for the light source.

The angle of the reference light incident on the infrared conversion device array unit is not particularly restricted with respect to local plasmon resonance in the metal fine particles, and in this aspect, a high degree of freedom is allowed in designing the infrared conversion devices. With infrared conversion devices using surface plasmon resonance, on the other hand, an incidence angle needs to be uniquely and accurately determined. In the present disclosure, a light source position and an incidence angle of the reference light may be appropriately determined by taking into account the positional relationship with the imaging device array unit, so that the infrared conversion device array unit is irradiated (illuminated) as evenly as possible with the reference light. With oblique light being used as the reference light, a large area can be irradiated. By virtue of the light gathering effect of local plasmon resonance, the metal fine particles can absorb the reference light with high efficiency even though the reference light enters obliquely. Also, even if the reference light has a light intensity distribution, local plasmon resonance can be certainly caused, since the frequency of light is constant. Where detected signals of the respective pixels are normalized with dynamic ranges to form a thermal image, the obtained thermal image does not depend on the light intensity distribution of the reference light.

Each reflective member may be formed with a base and a light reflection coating formed on the base, for example. The configuration and structure of the microlenses may be a known configuration and structure, and may be made of a known material.

The imaging device array unit may be formed with a CCD, a CMOS image sensor, a CIS (Contact Image Sensor), or a signal-amplifying image sensor of a CMD (Charge Modulation Device) type, or may be formed with a photo-sensor (such as a camera tube) other than image sensors. The imaging device array unit may be an imaging device array unit of a front-illuminated type, or may be an imaging device array unit of a back-illuminated type. With the imaging device array unit, a thermal image can be captured as a black-and-white image. That is, in a local plasmon resonance state, the intensity of scattering light is high, and accordingly, a bright image is obtained. At a portion where the temperature of the dielectric material or the light receiving material becomes higher, on the other hand, there is a deviation from the local plasmon resonance condition. Specifically, $\in_d$ changes and fails to satisfy $\in_m + 2\in_d = 0$. As a result, the intensity of the scattering light becomes lower, and the image becomes darker. In this manner, a black-and-white image in which the portions at lower temperatures are white while the portions at higher temperature are black can be obtained.

With an imaging apparatus of the present disclosure, a digital still camera, a video camera, a camcorder, or a so-called camera phone can be formed, for example. The imaging apparatus may include a lens system. The lens system may be a single focus lens or a so-called zoom lens, and the configurations and structures of the lens and the lens system may be determined based on the specification required for the lens and the lens system. The lens system in the imaging apparatus may have a conventional configuration. The infrared conversion device array unit may be housed in a vacuum-sealed package, so as to avoid external disturbance due to heat. The imaging apparatus of the present disclosure can be used in night-vision apparatuses, surveillance cameras, thermoviewers, on-vehicle night-vision cameras, medical near-infrared sensors, and the like.

EXAMPLE 1

Example 1 relates to infrared conversion devices, imaging apparatuses, and imaging methods according to the first and fourth embodiments of the present disclosure. FIGS. 1, 2, 3, and 4 are conceptual diagrams of imaging apparatuses of Example 1.

On the basis of the description of an infrared conversion device according to the first embodiment of the present disclosure, an infrared conversion device 121 of Example 1 includes: (a) a substrate 122; and (b) a metal fine particle layer 123 formed on the substrate 122, and the metal fine particle layer 123 is formed with metal fine particles 124 and a dielectric material 125 that fills gaps between the metal fine particles 124 and absorbs incident infrared rays.

On the basis of the description of an infrared conversion device according to the fourth embodiment of the present disclosure, the infrared conversion device 121 of Example 1 is an infrared conversion device, or more particularly, is an infrared conversion device of a spatial light modulation type that detects infrared rays converted into visible light by detecting a change caused in the permittivity of the light receiving material 125 by infrared absorption as a change in the intensity of scattering light based on local plasmon resonance.

On the basis of the description of an imaging apparatus according to the first embodiment or the fourth embodiment, an imaging apparatus 110 of Example 1 includes: (A) an infrared conversion device array unit 120 formed by arranging the infrared conversion devices 121 of Example 1 in a two-dimensional matrix fashion; (B) a light source 30 that emits reference light 31 to the infrared conversion device array unit 120; and (C) an imaging device array unit 40 that is located on the opposite side of the infrared conversion device array unit 120 from the infrared incidence side, or more specifically, is located at a distance from the infrared conversion device array unit 120.

Figure 2:
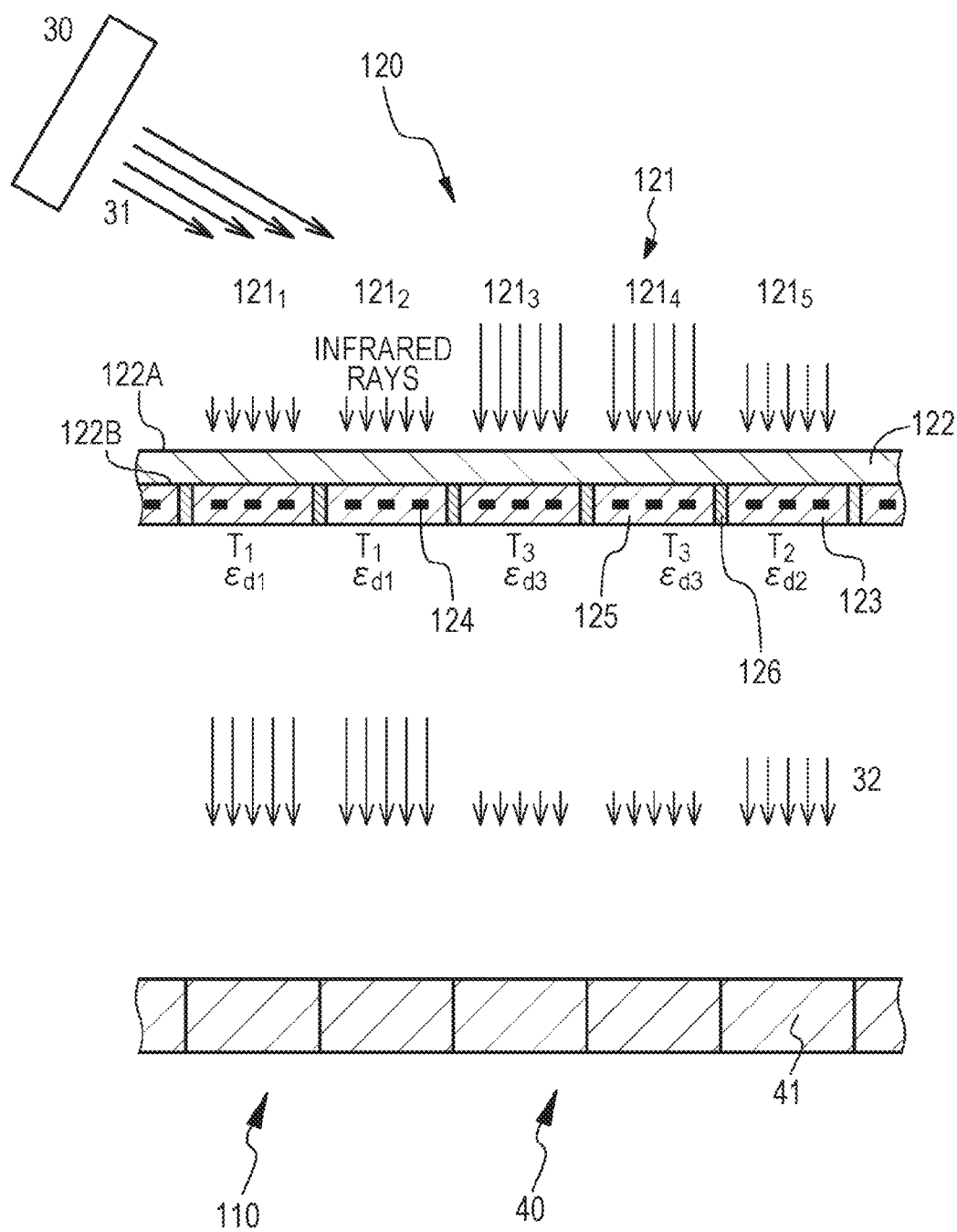
FIG. 2 is a conceptual diagram of a modification of the imaging apparatus of Example 1.
Figure 3:
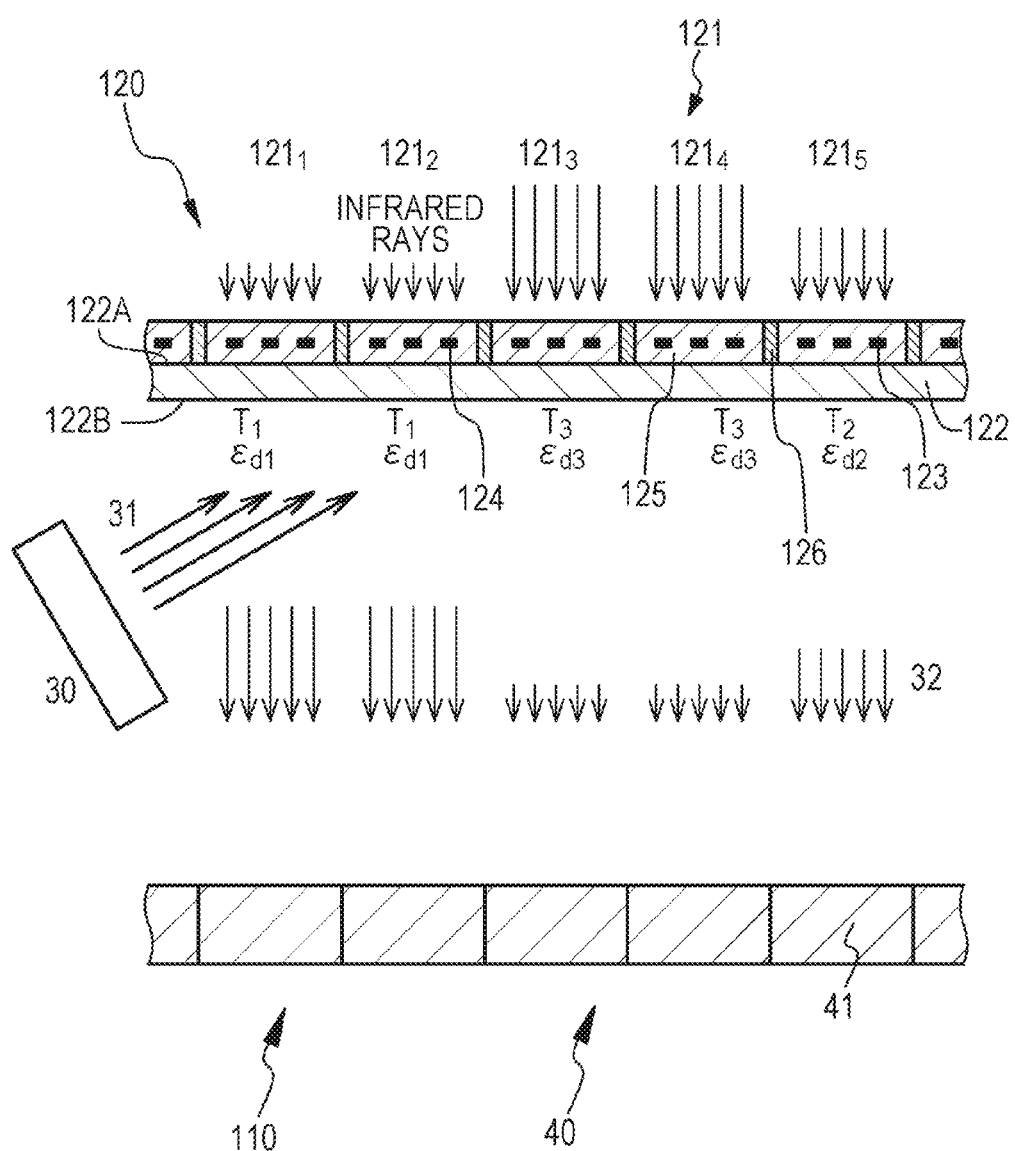
FIG. 3 is a conceptual diagram of another modification of the imaging apparatus of Example 1.
Figure 4:
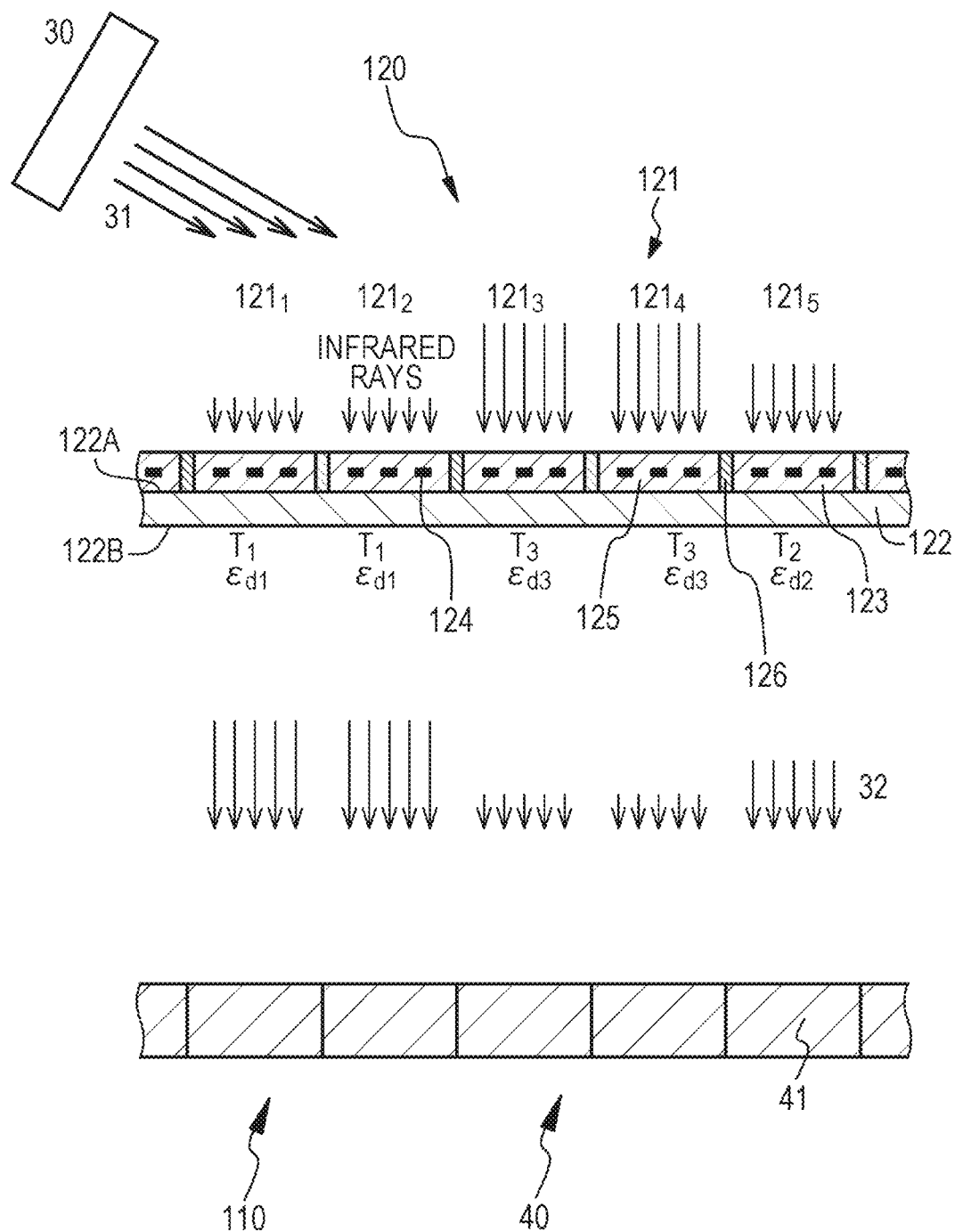
FIG. 4 is a conceptual diagram of yet another modification of the imaging apparatus of Example 1.

The structure shown in FIG. 1 is (Case 1) where infrared rays enter from a first surface 122A of the substrate 122, the metal fine particle layer 123 is formed on a second surface 122B on the opposite side of the substrate 122 from the first surface 122A, and the imaging device array unit 40 and the light source 30 are located on the side of the second surface 122B of the substrate 122. The reference light 31 irradiates (illuminates) the infrared conversion device array unit 120 from the opposite side of the infrared conversion device array unit 120 from the infrared incidence side. The structure shown in FIG. 2 is (Case 2) where infrared rays enter from the first surface 122A of the substrate 122, the metal fine particle layer 123 is formed on the second surface 122B on the opposite side of the substrate 122 from the first surface 122A, the imaging device array unit 40 is located on the side of the second surface 122B of the substrate 122, and the light source 30 is located on the side of the first surface 122A of the substrate 122. The reference light 31 irradiates (illuminates) the infrared conversion device array unit 120 from the infrared incidence side of the infrared conversion device array unit 120. Further, the structure shown in FIG. 3 is (Case 3) where infrared rays enter from the first surface 122A of the substrate 122, the metal fine particle layer 123 is formed on the first surface 122A of the substrate 122, and the imaging device array unit 40 and the light source 30 are located on the side of the second surface 122B of the substrate 122. The reference light 31 irradiates (illuminates) the infrared conversion device array unit 120 from the opposite side of the infrared conversion device array unit 120 from the infrared incidence side. The structure shown in FIG. 4 is (Case 4) where infrared rays enter from the first surface 122A of the substrate 122, the metal fine particle layer 123 is formed on the first surface 122A of the substrate 122, the imaging device array unit 40 is located on the side of the second surface 122B of the substrate 122, and the light source 30 is located on the side of the first surface 122A of the substrate 122. The reference light 31 irradiates (illuminates) the infrared conversion device array unit 120 from the infrared incidence side of the infrared conversion device array unit 120.

In any of those cases, the same image is obtained at the imaging device array unit 40. In the examples shown in FIGS. 2 and 4, however, the light source 30, the infrared conversion device array unit 120, and the imaging device array unit 40 need to be arranged so that the reference light 31 does not enter the imaging device array unit 40. Also, an imaging lens (not shown) for forming an image from light from the infrared conversion device array unit 120 onto the imaging device array unit 40 is provided between the infrared conversion device array unit 120 and the imaging device array unit 40. However, scattering light from the metal fine particles has a certain degree of directionality, and therefore, imaging can be performed without an imaging lens.

In the infrared conversion devices 121 of Example 1 or Examples 2 through 6, which will be described later, the substrate 122 is formed with germanium (Ge) of 1 μm in thickness. The dielectric material 125 is formed with polyamide resin of 0.1 μm in thickness.

In the infrared conversion devices 121, 221, or 321 of Example 1 or Examples 2 through 8, which will be described later, the metal fine particles 124 are formed with silver (Ag), and has a disk-like shape of 100 nm in diameter and 50 nm in thickness. The metal fine particles 124 are regularly arranged. Specifically, the metal fine particles 124 arranged based on a regular two-dimensional array pattern such as a square. The nearest center-to-center distance between the metal fine particles (the two-dimensional periodic array size of the metal fine particles) is 0.3 μm. These numerical values are determined based on the wavelength of the reference light to be used and the dielectric material 125 to be used.

Specifically, in Example 1 or Examples 2 through 8, which will be described later, the light source 30 is formed with a light emitting diode (LED) that emits the reference light 31 of 500 nm, for example. With irradiation with the reference light 31 of such a wavelength, the temperature of the dielectric material 125, 225, or 325 hardly rises. Even if the temperature of the dielectric material 125, 225, or 325 slightly rises, the temperature rise is eliminated as part of background radiation and does not affect signal detection, as long as the local plasmon resonance condition is calibrated as the initial state that takes into account an increase in the temperature of the dielectric material 125, 225, or 325. The reference light emitted from the light source 30 travels through a collimating optical system (not shown), for example, and then irradiates (illuminates) the infrared conversion device array unit 120. The wavelength of the reference light 31 emitted from the above described light source 30 is variable in the range of ±100 nm. With this, the local plasmon resonance condition described later in Examples 5 and 6 can be readily calibrated. As a rule, the reference light 31 obliquely irradiates the infrared conversion device array unit 120 constantly during normal operation of the imaging apparatus. The imaging device array unit 40 is formed by arranging imaging devices 41 in a two-dimensional matrix fashion, and is formed with conventional CCDs or CMOS image sensors. The size of each infrared conversion device 121, 221, or 321 (the size of one pixel in the infrared conversion device array unit 120, 220, or 320) is 10 μm. The size of each infrared conversion device 121, 221, or 321 (the size of one pixel in the infrared conversion device array unit 120, 220, or 320) is the same as the size of each imaging device 41 in the imaging device array unit 40 (the size of one pixel in the imaging device array unit), but the latter may be smaller than the former. Reference numerals 126, 226, and 326 indicate separation regions for separating the infrared conversion devices 121, 221, or 321 from one another to form pixels.

According to the imaging method of Example 1 or Examples 2 through 8, which will be described later, the imaging device array unit 40 detects a decrease caused in the intensity of scattering light 32 when the local plasmon resonance state in the metal fine particles 124, 224, or 324 is changed by irradiation of the metal fine particles 124, 224, or 324 with the reference light 31, since the permittivity $\in_d$ of the dielectric material 125, 225, or 325 changes due to infrared absorption. Alternatively, the imaging device array unit 40 detects a decrease caused in the intensity of the scattering light 32 when the local plasmon resonance state in the light receiving material 125, 225, or 325 is changed by irradiation of the light receiving material 125, 225, or 325 with the reference light 31, since the permittivity $\in_d$ of the light receiving material 125, 225, or 325 changes due to infrared absorption. That is, the permittivity $\in_d$ of the dielectric material 125, 225, or 325 changes due to infrared absorption. The local plasmon resonance state formed in the metal fine particles 124, 224, or 324 by irradiation of the metal fine particles 124, 224, or 324 with the reference light 31 changes due to a change in the permittivity $\in_d$ of the dielectric material 125, 225, or 325. This change in the local plasmon resonance state causes a decrease in the intensity of the scattering light 32. The imaging device array unit 40 detects the decrease in the intensity of the scattering light 32.

More specifically, in the infrared conversion devices of Example 1 or Examples 2 through 8, which will be described later, local plasmon resonance is caused in the metal fine particles by irradiation of the metal fine particles 124, 224, or 324 with the reference light 31. The scattering light 32 is then generated based on the local plasmon resonance. The frequency or the angular frequency of the scattering light 32 is the same as the frequency or the angular frequency of the reference light 31. Meanwhile, the permittivity of the dielectric material (the light receiving material) 125, 225, or 325 changes due to infrared absorption. In FIGS. 1 through 4, the intensities of infrared rays incident on the infrared conversion device array unit 120 are represented by the lengths of arrows, for convenience. The longer an arrow, the higher the intensity of the corresponding infrared ray incident on the infrared conversion device array unit 120.

The local plasmon resonance state in the metal fine particles 124, 224, or 324 changes due to a change in the permittivity of the dielectric material (the light receiving material) 125, 225, or 325. Specifically, as a result of a change in the local plasmon resonance state (in other words, as a result of an end of the local plasmon resonance state, or as a result of a change in $\in_d$, failing to satisfy $\in_m + 2\in_d = 0$), the intensity of the scattering light 32 becomes lower. In FIGS. 1 through 4, the intensities of the scattering light 32 emitted from the infrared conversion device array unit 120 are represented by the lengths of arrows, for convenience. The longer an arrow, the higher the intensity of the corresponding scattering light 32 emitted from the infrared conversion device array unit 120.

In the imaging device array unit 40, such an image can be captured as a thermal image of a black-and-white image. That is, in a local plasmon resonance state, the intensity of scattering light is high, and accordingly, a bright image is obtained. At a portion where the temperature of the dielectric material or the light receiving material becomes higher, on the other hand, there is a deviation from the local plasmon resonance condition. As a result, the intensity of the scattering light becomes lower, and the image becomes darker. In this manner, a black-and-white image in which the portions at lower temperatures are white while the portions at higher temperature are black can be obtained.

For example, the intensities of the infrared rays incident on the infrared conversion devices $121_1$ and $121_2$ are low. Meanwhile, the intensities of the infrared rays incident on the infrared conversion devices $121_3$ and $121_4$ are high, and the intensity of the infrared rays incident on the infrared conversion device $121_5$ is medium. As a result, the temperature of the dielectric material (the light receiving material) 125 of the infrared conversion devices $121_1$ and $121_2$ is $T_1$, and the permittivity at the temperature is $\in_{d1}$. Meanwhile, the temperature of the dielectric material (the light receiving material) 125 of the infrared conversion devices $121_3$ and $121_4$ is $T_3$, and the permittivity at the temperature is $\in_{d3}$. The temperature of the dielectric material (the light receiving material) 125 of the infrared conversion device $121_5$ is $T_2$ (provided that $T_1 < T_2 < T_3$), and the permittivity at the temperature is $\in_{d2}$ (provided that $\in_{d1} < \in_{d2} < \in_{d3}$). As a result, in the infrared conversion devices $121_1$ and $121_2$, there is almost no deviation from the local plasmon resonance condition. In the infrared conversion device $121_5$, there is a deviation from the local plasmon resonance condition. In the infrared conversion devices $121_3$ and $121_4$, there is a large deviation from the local plasmon resonance condition. Therefore, the intensity of the scattering light from the infrared conversion devices $121_1$ and $121_2$ is high, the intensity of the scattering light from the infrared conversion device $121_5$ is medium, and the intensity of the scattering light from the infrared conversion devices $121_3$ and $121_4$ is low.

The infrared conversion devices 121 of Example 1 can be manufactured in the following manner. First, part of the dielectric material 125 is formed on the substrate 122 by CVD, PVD, a coating technique, a printing technique including an ink jet printing technique, a spin coat technique, or the like. A thin metal film made of silver (Ag) is formed on the dielectric material 125 by a vacuum deposition technique or the like, and etching is then performed on the thin metal film by a photolithography technique and an etching technique. In this manner, the metal fine particles 124 that are formed with silver and are arranged based on a regular two-dimensional array pattern such as a square can be formed on the dielectric material 125. After that, the remaining part of the dielectric material 125 is formed again by CVD, PVD, a coating technique, a printing technique including an ink jet printing technique, a spin coat technique, or the like. In this manner, the metal fine particle layer 123 that has the metal fine particles 124 coated with the dielectric material 125, or has the metal fine particles 124 surrounded by the dielectric material 125, can be obtained. The separation regions 126 can be formed by patterning at the time of formation of the dielectric material 125 and the metal fine particles 124. In a case where a printing technique is used, the separation regions 126 can be formed at the same time as the formation of the dielectric material 125 and the metal fine particles 124 by the printing technique.

The infrared conversion device array unit 120, obtained in this manner, the light source 30, and the imaging device array unit 40 are housed in an appropriate package according to a known technique, and are assembled together with a lens system. Thus, an imaging apparatus can be obtained.

Figure 5A:
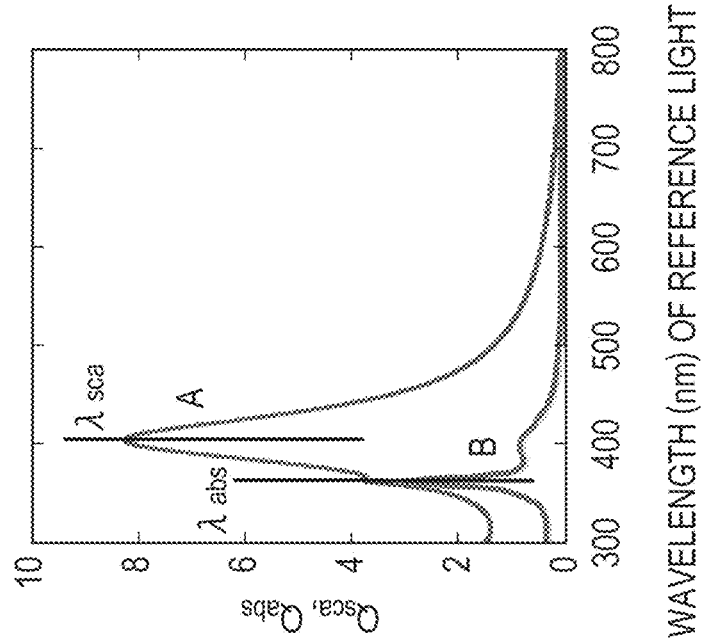
FIGS. 5A and 5B are graphs showing the results of simulations performed to examine the scattering efficiency $Q_{sca}$ and the absorption efficiency $Q_{abs}$ of metal fine particles formed with silver (Ag) in relation to the wavelength of reference light.
Figure 5B:
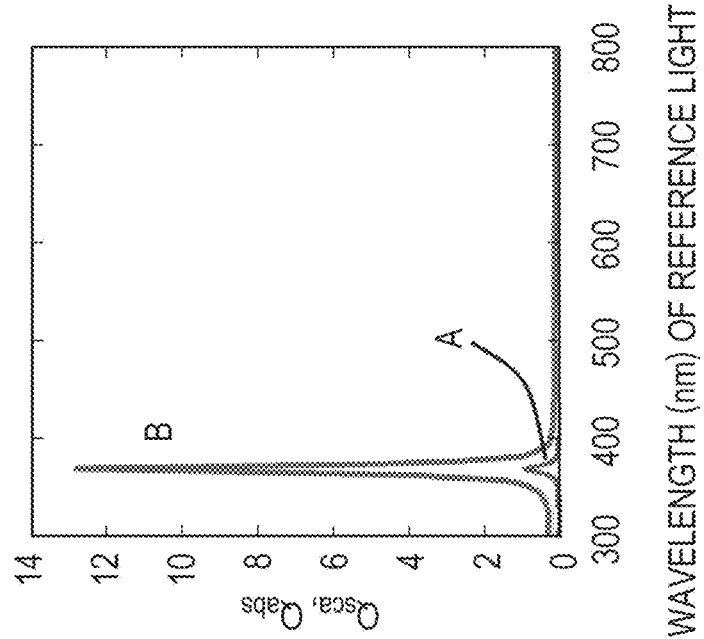
Figure 6A:
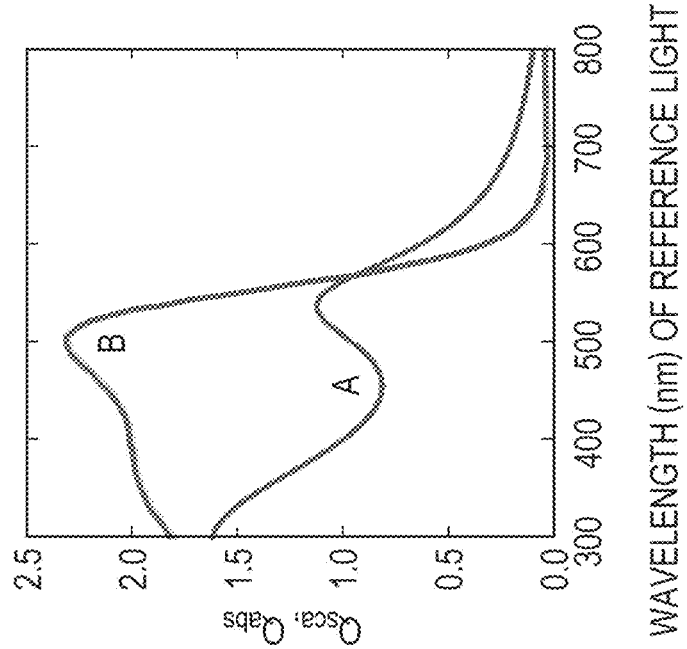
FIGS. 6A and 6B are graphs showing the results of simulations performed to examine the scattering efficiency $Q_{sca}$ and the absorption efficiency $Q_{abs}$ of metal fine particles formed with gold (Au) in relation to the wavelength of reference light.
Figure 6B:
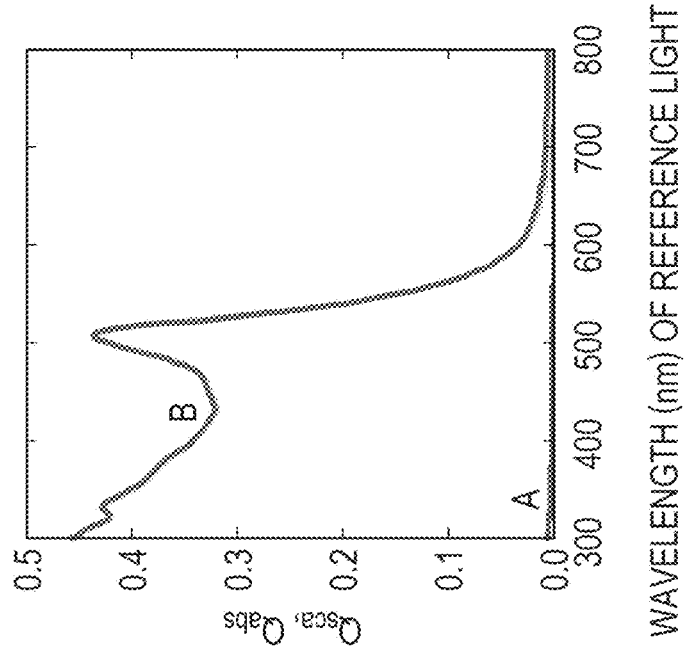

FIGS. 5A, 5B, 6A, and 6B show the results of simulations performed to examine the scattering efficiency $Q_{sca}$ and the absorption efficiency $Q_{abs}$ of a metal fine particle in relation to the wavelength $\lambda$ of reference light on the assumption that one spherical metal fine particle is placed in the air. In each graph, the abscissa axis indicates the wavelength $\lambda$ (unit: nm) of the reference light, and the ordinate axis indicates the values of the scattering efficiency $Q_{sca}$ and the absorption efficiency $Q_{abs}$. FIG. 5A shows the results of a case where the metal fine particle has a diameter of 100 nm and is formed with silver (Ag), and FIG. 5B shows the results of a case where the metal fine particle has a diameter of 20 nm and is formed with silver (Ag). FIG. 6A shows the results of a case where the metal fine particle has a diameter of 100 nm and is formed with gold (Au), and FIG. 6B shows the results of a case where the metal fine particle has a diameter of 20 nm and is formed with gold (Au). Here, the scattering efficiency $Q_{sca}$ and the absorption efficiency $Q_{abs}$ are values obtained by dividing the scattering cross section and the absorption cross section, respectively, by the cross section of the metal fine particle. A high value of the absorption efficiency $Q_{abs}$ means that the metal fine particle generate a large amount of heat as a result of irradiation with the reference light. Therefore, the value of the scattering efficiency $Q_{sca}$ is preferably higher than the value of the absorption efficiency $Q_{abs}$. In each of FIGS. 5A, 5B, 6A, and 6B, the curve "A" represents the scattering efficiency $Q_{sca}$, and the curve "B" represents the absorption efficiency $Q_{abs}$. As can be seen from the simulation results shown in FIGS. 5A, 5B, 6A, and 6B, the case where the metal fine particle has a diameter of 100 nm and is formed with silver (Ag) is the most preferable. Where the wavelength $\lambda_{abs}$ of the reference light with which the peak value of the absorption efficiency $Q_{abs}$ is obtained differs from the wavelength $\lambda_{sca}$ of the reference light with which the peak value of the scattering efficiency $Q_{sca}$ is obtained, heat loss can be prevented.

Figure 7A:
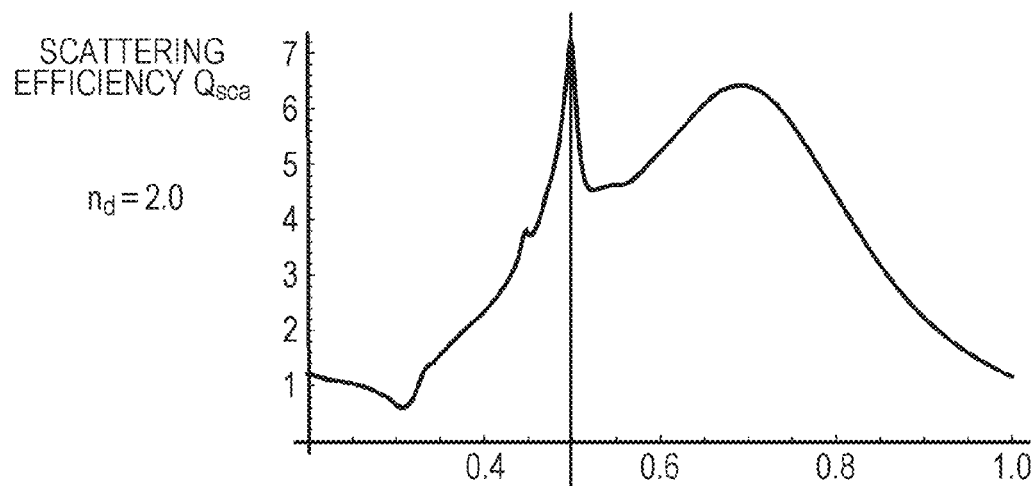
FIGS. 7A and 7B are graphs showing the results of simulations performed to examine how the scattering efficiency of metal fine particles varies with changes in the refractive index of a dielectric material.
Figure 7B:
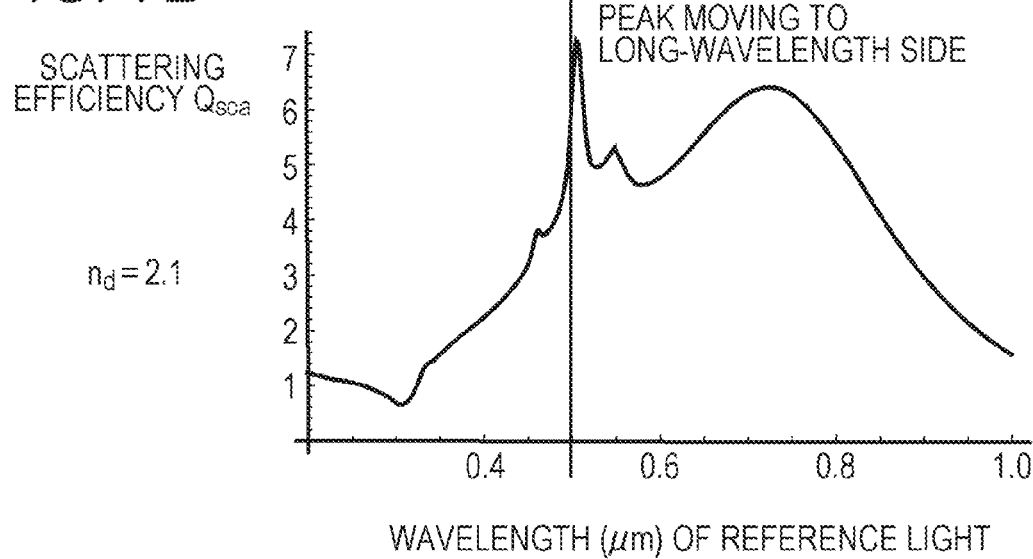

FIG. 7A (refractive index $n_d$=2.0) and FIG. 7B (refractive index $n_d$=2.1) show the results of simulations performed to examine the scattering efficiency $Q_{sca}$ of a metal fine particle in relation to the wavelength $\lambda$ of reference light on the assumption that one spherical metal fine particle (which has a diameter of 100 nm and is formed with silver) is placed in a dielectric material (with the refractive index $n_d$=2.0 and 2.1).

Where the refractive index $n_d$ is 2.0, the wavelength $\lambda_{sca}$ of the reference light with which the peak value of the scattering efficiency $Q_{sca}$ is obtained is as follows.

$\lambda_{sca}$=500 nm

Peak value of $Q_{sca}$=7.2057

Meanwhile, where the refractive index $n_d$ is 2.1, the wavelength $\lambda_{sca}$ of the reference light with which the peak value of the scattering efficiency $Q_{sca}$ is obtained is as follows. The scattering efficiency $Q_{sca}'$ when the wavelength $\lambda$ of the reference light is 500 nm is as follows.

$\lambda_{sca}$=508.9 nm $Q_{sca}'$=6.04597

Figure 8:
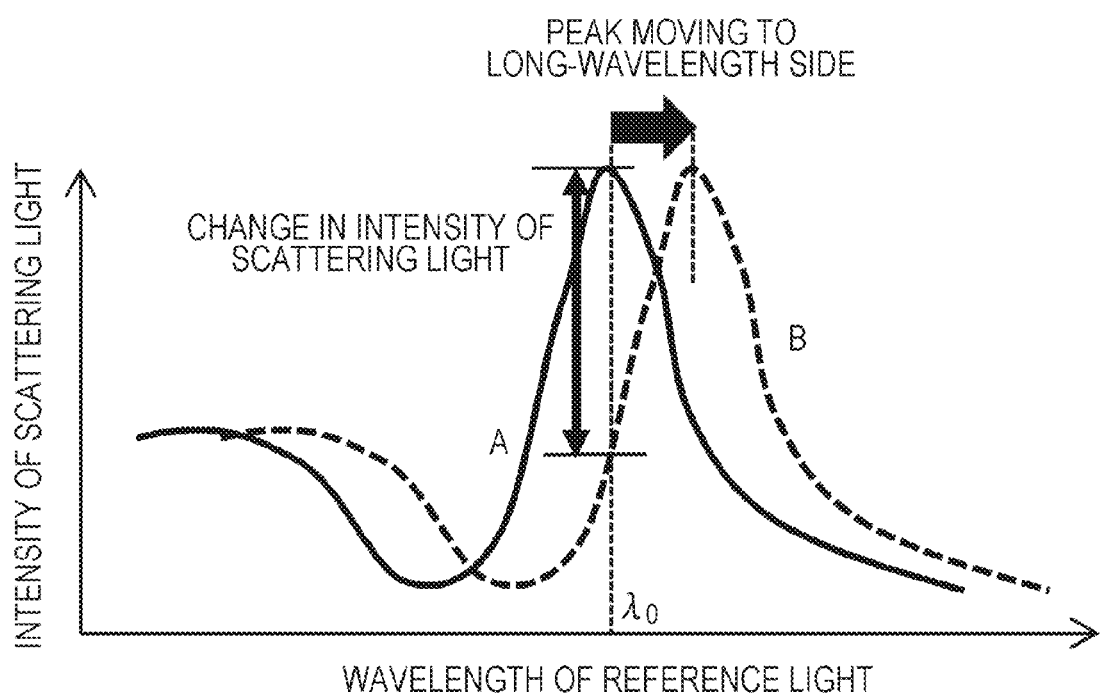
FIG. 8 is a graph schematically showing changes in scattering efficiency based on changes in refractive index in an overlapping manner.

FIG. 8 schematically shows such changes in the scattering efficiency $Q_{sca}$ based on changes in the refractive index $n_d$ in an overlapping manner. In FIG. 8, the curve A indicates a case where the temperature of the dielectric material in an infrared conversion device is $T_1$, the refractive index is $n_{d-1}$, and a local plasmon resonance state is formed when the wavelength of the reference light is $\lambda_0$. On the other hand, the curve B indicates a case where the temperature of the dielectric material in another infrared conversion device is $T_2$ ($>T_1$), the refractive index is $n_{d-2}$ ($\neq n_{d-1}$), and a local plasmon resonance state is not formed when the wavelength of the reference light is $\lambda_0$. The length of the arrow indicates the amount of change in the intensity of the scattering light.

Figure 9:
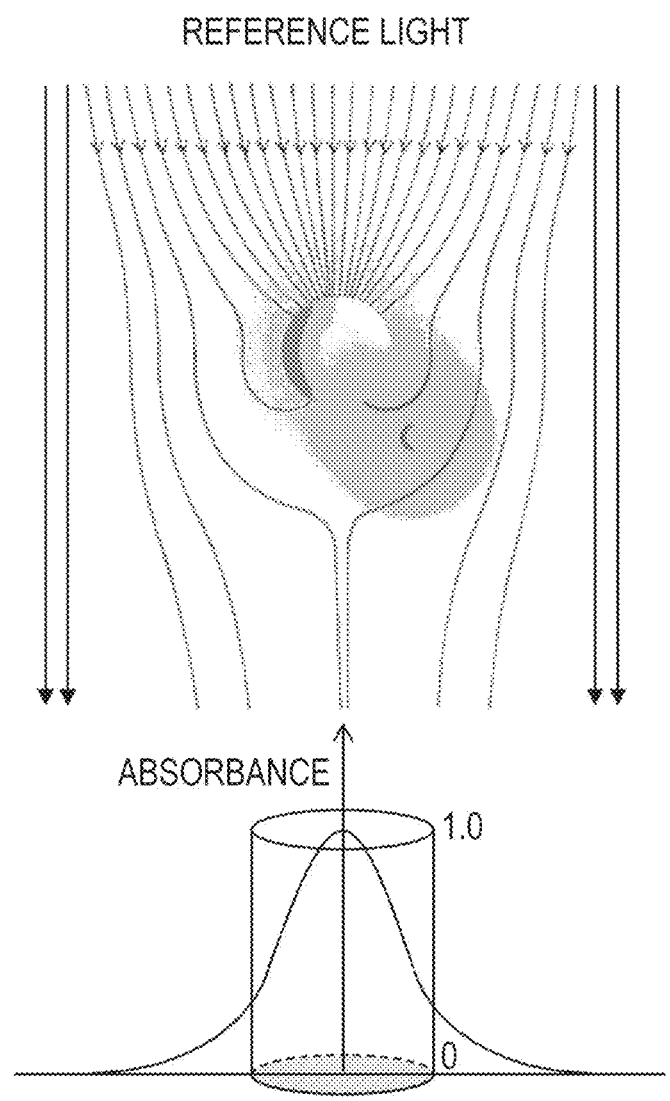
FIG. 9 is a conceptual diagram illustrating an examination on the light gathering capability of one spherical metal fine particle.

By virtue of the light gathering effect of local plasmon resonance, the metal fine particles can absorb the reference light with high efficiency even though the reference light enters obliquely. The light gathering capability of one spherical metal fine particle was examined. This is equivalent to a calculation of a quenching cross section ($C_{ext}=C_{abs}+C_{sca}$). Specifically, the quenching cross section was calculated as the cross section of a cylinder where a metal fine particle absorbance distribution (having the maximum value immediately above the metal fine particle) that spread like a Gaussian distribution was replaced with a cylinder having a height of 1.0 (the highest absorbance). FIG. 9 shows a conceptual diagram. $C_{ext}$ at the wavelength of the reference light with respect to a metal fine particle formed with silver was calculated by taking Mie scattering into account. The metal fine particle was supposedly placed in vacuum. The values of $C_{ext}$ converted into radii are as follows, and are more than twice larger than the radii of metal fine particles. The curves shown in FIG. 9 indicate pointing vectors (energy flows of light), and include incident light and scattering light.

| Radius of metal fine particle | $C_{ext}$ | Converted radius |
|---|---|---|
| 10 nm | 0.015 μm² | 22 nm |
| 100 nm | 0.18 μm² | 240 nm |

As for the infrared conversion devices, the imaging apparatus, and the imaging method of Example 1 or Examples 2 through 8, which will be described later, there is no need to cool the infrared conversion devices, and infrared rays (heat rays) that are simply optically, not electrically, subjected to spatial light modulation can be detected. Accordingly, it is possible to provide infrared conversion devices that have high spatial resolution and can detect very small temperature differences (such as a temperature difference of approximately $5 \times 10^{-3}$° K between infrared conversion devices) in spite of its simple configuration and structure. It should be noted that infrared conversion devices of smaller size can more precisely detect smaller temperature differences. Also, it is possible to provide an imaging apparatus that includes the above described infrared conversion devices, is not affected by background radiation, has a high S/N ratio, does not require calibration for each pixel and a large-capacity memory, does not form discontinuous images, is small in size and weight, consumes less power, and is inexpensive. It is also possible to provide an imaging method using such an imaging apparatus. Furthermore, as local plasmon resonance is used, there is no surface propagation of plasmon, and higher spatial resolution than that with spatial light modulation using surface plasmon resonance can be achieved. Moreover, optical components such as a prism are not necessary, and there is no restriction on the incidence angle of the reference light. Accordingly, a higher degree of freedom is allowed in design. Further, infrared rays (heat rays) that are simply optically, not electrically, subjected to spatial light modulation can be detected. Accordingly, heat diffusion (dissipation) through interconnects does not easily occur, smaller temperature changes can be detected, and quick responses are obtained.

EXAMPLE 2

Figure 10:
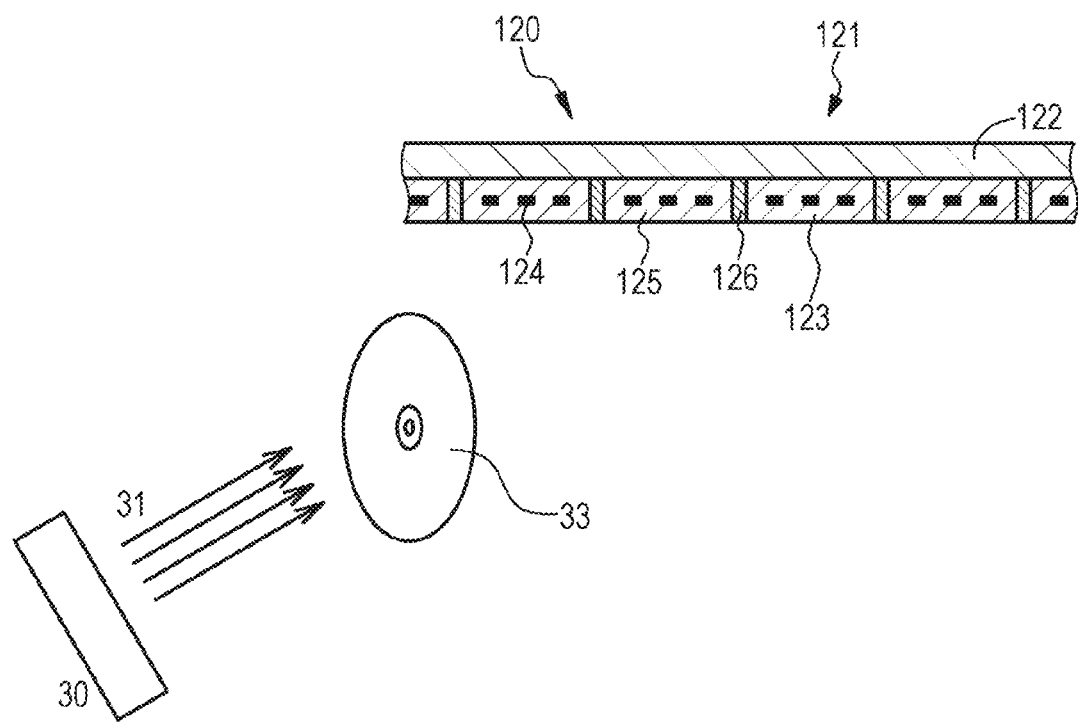
FIG. 10 is a conceptual diagram of an imaging apparatus of Example 2.

Example 2 is a modification of Example 1. In Example 1, the wavelength of the reference light is variable. In Example 2, on the other hand, a wavelength selector 33 that selects a wavelength of the reference light 31 is provided between the light source 30 and the infrared conversion device array unit 120. Specifically, as shown in a conceptual diagram of an imaging apparatus of Example 2 in FIG. 10, the wavelength selector 33 is formed with a color filter. The color filter is a rotative disk-like filter, and is formed with a filter material that can continuously change the wavelength of passing reference light depending on the position with and through which the reference light from the light source collides and passes. With this, the local plasmon resonance condition described later in Examples 5 and 6 can also be readily calibrated.

EXAMPLE 3

Figure 11A:
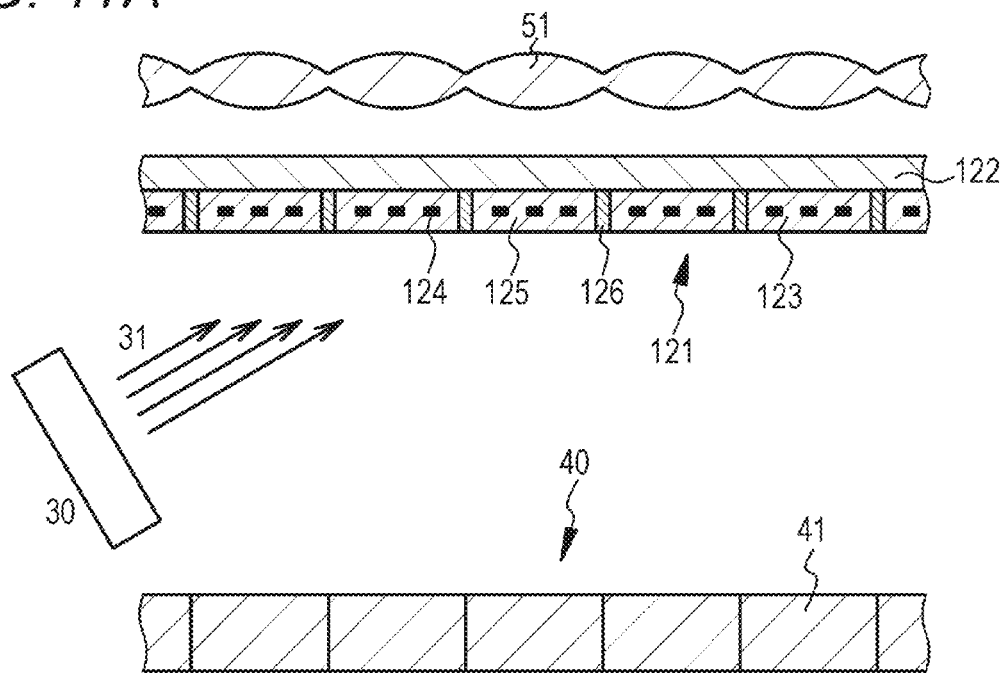
FIGS. 11A and 11B are conceptual diagrams of imaging apparatuses of Example 3 and Example 4, respectively.

Example 3 is a modification of Examples 1 and 2. As shown in a conceptual diagram of an imaging apparatus in FIG. 11A, in Example 3, a microlens 51 is provided on the infrared incidence side of each infrared conversion device. With this structure, infrared rays can be effectively gathered onto the respective infrared conversion devices. The configuration and structure of the microlenses 51 may be a known configuration and structure, and may be made of a known material.

EXAMPLE 4

Figure 11B:
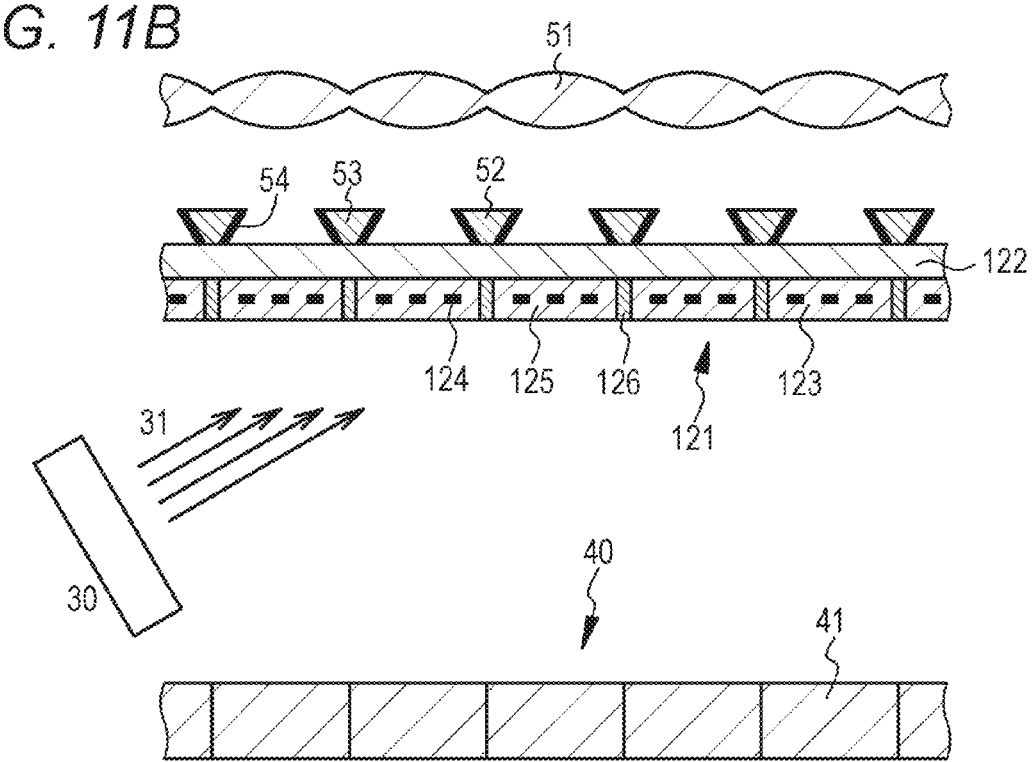

Example 4 is a modification of Examples 1 through 3. As shown in a conceptual diagram of an imaging apparatus in FIG. 11B, in Example 4, a reflective member 52 that reflects scattering light toward the metal fine particle layer or the light receiving material is provided on the infrared incidence side of each infrared conversion device. The example shown in FIG. 11B is a modification of the imaging apparatus of Example 3. Each reflective member 52 is formed with a base 53 and a light reflection coating 54 formed on the base 53. The reflective members 52 can be manufactured by using a known MEMS manufacturing technology, for example.

EXAMPLE 5

Example 5 is a modification of Examples 1 through 4. While an imaging apparatus is used, the wavelength $\lambda_0$ of the reference light with which a local plasmon resonance state is obtained changes or deviates due to various factors. In such a case, calibration needs to be performed to obtain local plasmon resonance. In view of this, an imaging apparatus of Example 5 includes a light blocking mechanism for calibrating detection of the intensity of scattering light. Calibration may be performed when the imaging apparatus is powered on, for example.

Specifically, as shown in conceptual diagrams of imaging apparatuses in FIGS. 12A, 12B, 13A, and 13B, the light blocking mechanism is formed with a shutter mechanism 61 that controls infrared rays incident on the dielectric material (the light receiving material) 125, 225, or 325. The shutter mechanism 61 may be formed with a known shutter mechanism. As shown in the conceptual diagram of an imaging apparatus in FIG. 13A, a second shutter mechanism 62 may be further provided between the infrared conversion device array unit 120 and the imaging device array unit 40, or in the vicinity of the light source 30. The shutter mechanisms 61 and 62 may be mechanically operated, or may be electrically operated. A lens cap may be used as a substitute for the shutter mechanism 61.

FIGS. 18A, 18B, 19A, and 19B are diagrams for explaining relationships among background radiation and the like, the intensity of scattering light, and the intensity of an output signal.

Figure 12A:
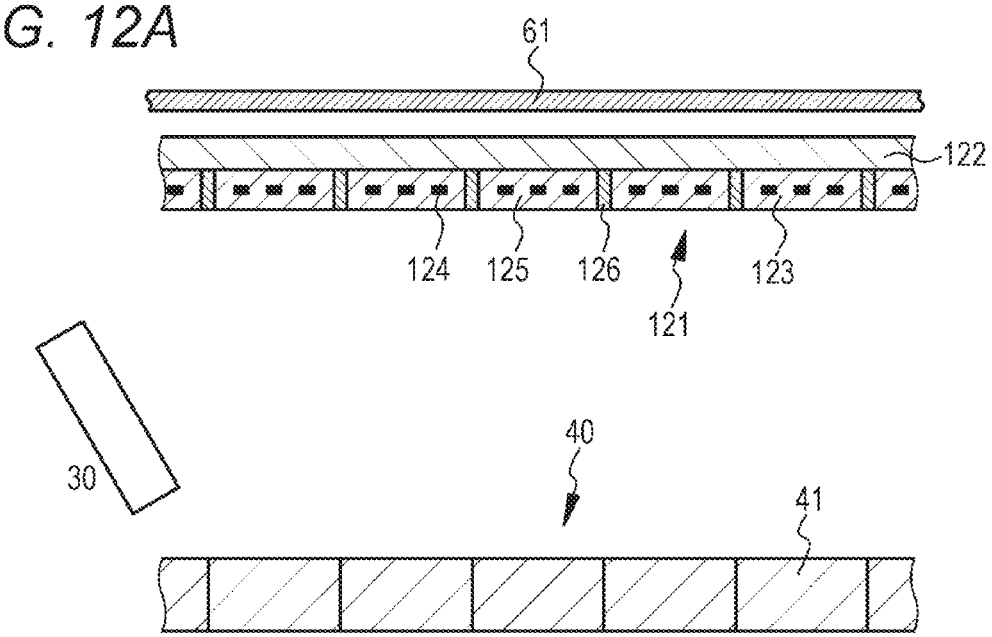
FIGS. 12A and 12B are conceptual diagrams of an imaging apparatus of Example 5.
Figure 13A:
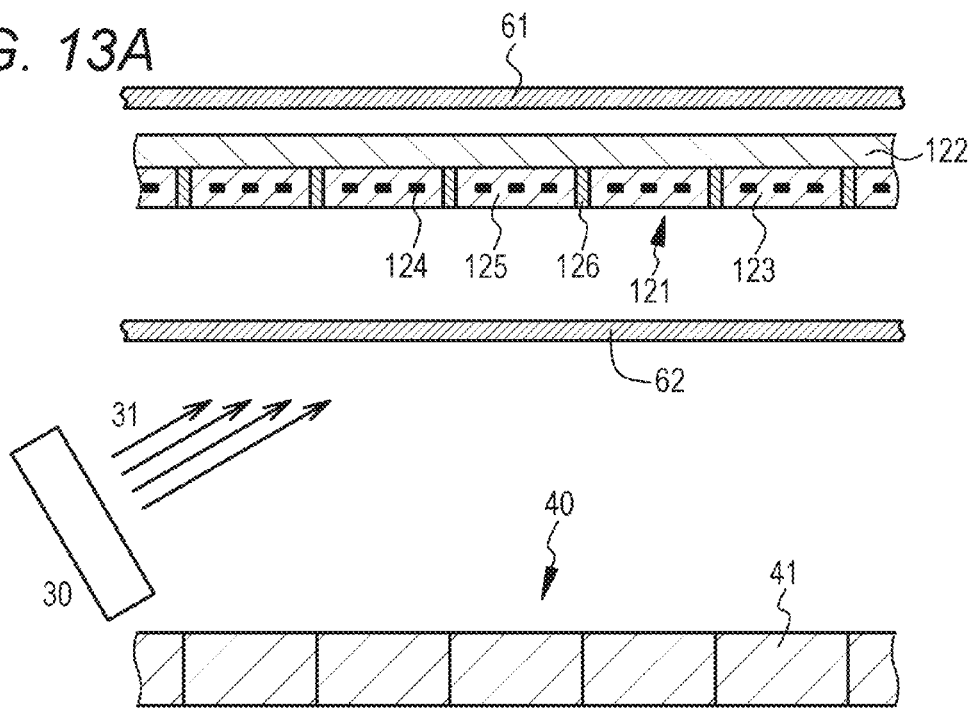
FIGS. 13A and 13B are conceptual diagrams of a modification of the imaging apparatus of Example 5.

As shown in FIG. 12A, while irradiation of the infrared conversion device array unit 120 with the reference light 31 is suspended, the shutter mechanism 61 is closed, to prevent infrared rays from entering the infrared conversion device array unit 120. Alternatively as shown in FIG. 13A, while irradiation with the reference light 31 is continued, the shutter mechanisms 61 and 62 are closed, to prevent infrared rays from entering the infrared conversion device array unit 120 and the reference light from irradiating (illuminating) the infrared conversion device array unit 120. In such situations, an image is obtained by the imaging device array unit 40. The image obtained at this point will be referred to as an "optical black image", for convenience. The light intensity $I_B$ obtained in the imaging device array unit 40 in such situations is the light intensity based on external environments such as background radiation and environmental temperature (see FIGS. 18A and 19A).

Figure 12B:
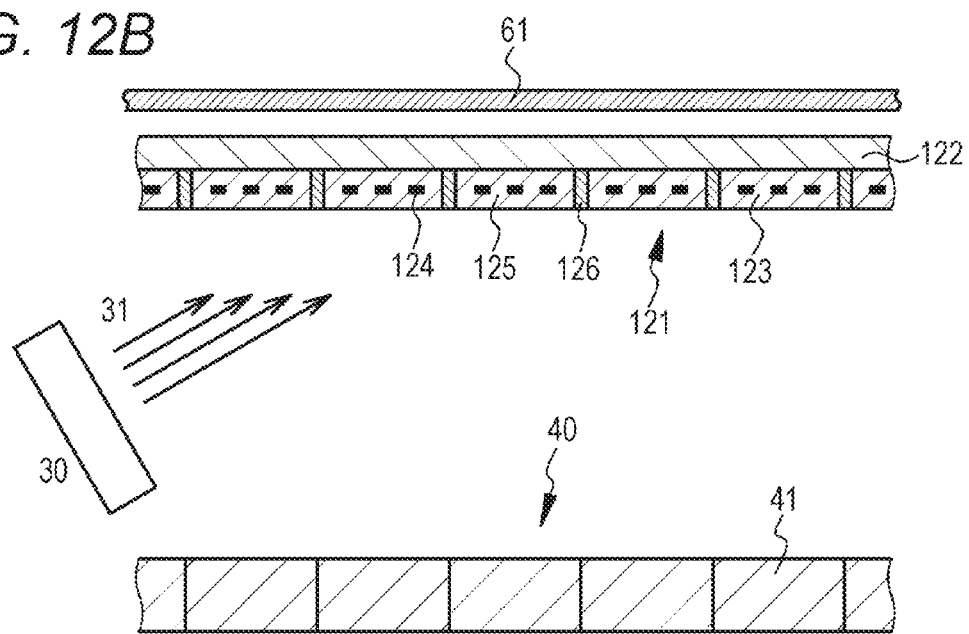
Figure 13B:
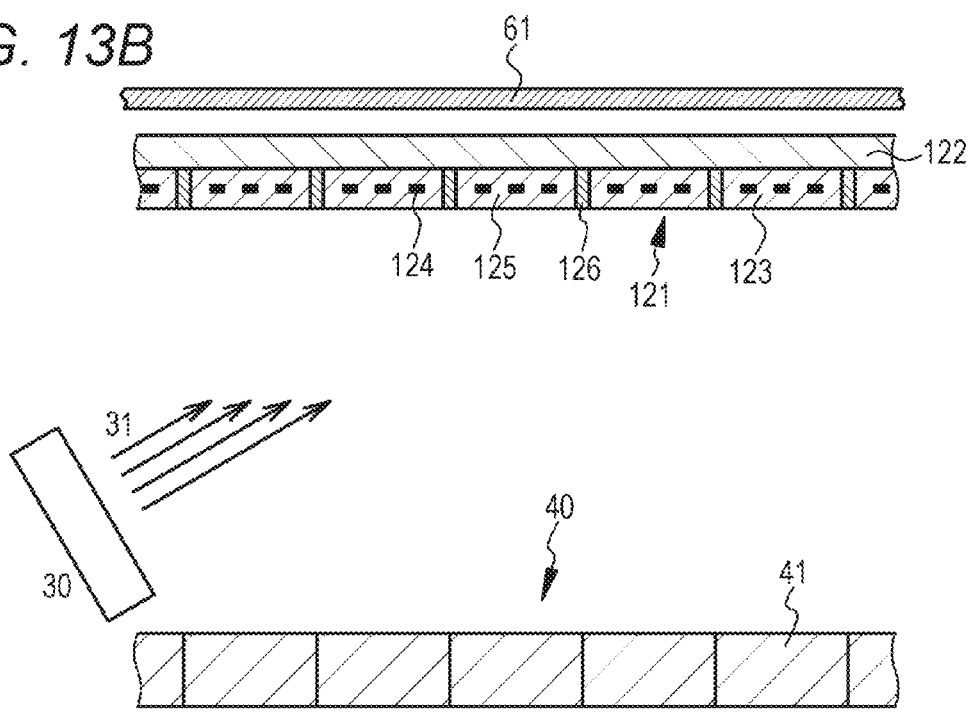

Next, as shown in FIG. 12B or 13B, while the shutter mechanism 61 is closed, and infrared rays are prevented from entering the infrared conversion device array unit 120, the infrared conversion device array unit 120 is irradiated (illuminated) with the reference light 31. In this situation, an image is obtained by the imaging device array unit 40. The image obtained at this point will be referred to as an "optical white image", for convenience. The light intensity $I_W$ obtained in the imaging device array unit 40 in this situation is the sum of the light intensity based on external environments such as background radiation and environmental temperature, and the intensity of the scattering light 32 emitted from the infrared conversion device array unit 120 (see FIGS. 18B and 19B). Accordingly, the value of $(I_W-I_B)$ is a value that is not affected by external environments such as background radiation and environmental temperature. It should be noted that the value of $(I_W-I_B)$ might vary among the infrared conversion devices 121 (see FIG. 19A).

Values of $(I_W-I_B)$ are calculated by varying the wavelength $\lambda$ of the reference light. The wavelength $\lambda_{max}$ of the reference light with which the largest value of $(I_W-I_B)$ is obtained is the wavelength $\lambda_0$ of the reference light with which a local plasmon resonance state is formed. In this manner, calibration can be performed to obtain local plasmon resonance.

In an infrared conversion device, the value of $I_{max}(=I_W-I_B)$ at the wavelength $\lambda_0$ of the reference light with which a local plasmon resonance state is formed is equivalent to the dynamic range of the infrared conversion device. There are cases where all the infrared conversion devices have almost the same dynamic ranges (see FIG. 18A), and there are cases where the dynamic ranges differ from one infrared conversion device to another (see FIG. 19A). The value of $I_{max}$ varies depending not only on variations in manufacture of the respective infrared conversion devices but also on various other factors such as chronological changes, irradiation states of the reference light, and environmental temperature. However, if the values of $I_{max}$, $I_W$, and $I_B$ are determined in each infrared conversion device, the signal intensity S based on the light intensity I obtained in each imaging device corresponding to each infrared conversion device can be obtained. Here, the signal intensity corresponding to $I_{max}$ ($=I_W-I_B$) is represented by $S_{max}$.

$$S=(I/I_{max})\times S_{max}$$

As described above, even if background radiation and the like are not fixed, or even if illumination states of the reference light in the infrared conversion device array unit 120 are not uniform, the signal intensities corresponding to the intensities of incident infrared rays can be accurately determined. That is, where detected signals of the respective pixels are normalized with dynamic ranges to form a thermal image, the obtained thermal image does not depend on the light intensity distribution of the reference light and the like. Since the value of $I_W$ depends on the intensity of the reference light, the dynamic ranges can be readily widened by increasing the intensity of the reference light. In the formation of a thermal image, the differences from $I_W$ as indicated by an arrow A in FIGS. 18B and 19B may represent the signal intensities, or the differences from $I_B$ as indicated by an arrow B in FIGS. 18B and 19B may represent the signal intensities.

EXAMPLE 6

Example 6 is a modification of Example 5, and is capable of obtaining an optical black image (light intensity $I_B$) any time even during irradiation with the reference light 31. In Example 6, as shown in FIGS. 14A, 14B, 15A, and 15B, the infrared conversion device array unit 120 includes an infrared detection region 120A and a calibration region 120B for calibrating detection of the intensity of scattering light. In the calibration region, a light blocking film 127A, 127B, 127C, or 127D for preventing incidence of infrared rays is formed. In a boundary region between the infrared detection region 120A and the calibration region 120B, a light blocking member 128A, 128B, 128C, or 128D is provided in an appropriate manner. For example, the calibration region 120B is formed along the outer rim of the infrared conversion device array unit 120, so as to surround the infrared detection region 120A.

Figure 14A:
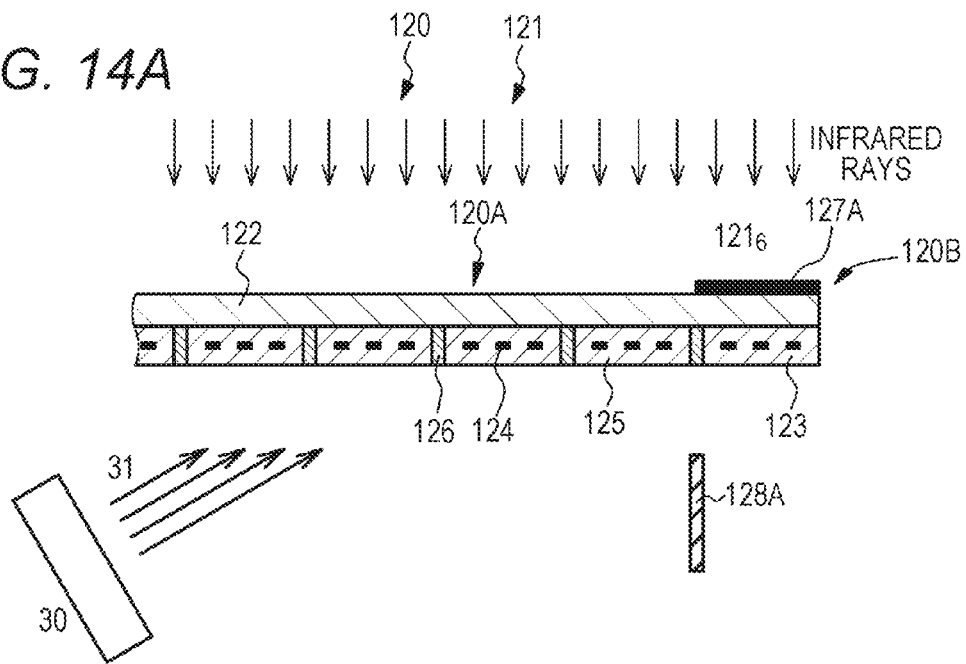
FIGS. 14A and 14B are conceptual diagrams of an imaging apparatus of Example 6.

In the example shown in FIG. 14A, the calibration region 120B is formed with one or more infrared conversion devices $121_6$. The light blocking film 127A that prevents incidence of infrared rays is formed on a portion of the substrate 122 on the infrared incidence side, the portion corresponding to the infrared conversion device $121_6$. In a boundary region between the infrared detection region 120A and the calibration region 120B, the light blocking member 128A is provided in an appropriate manner so that the scattering light or the like from the metal nanoparticles in the infrared detection region 120A does not enter the imaging device facing the calibration region 120B. The light blocking member 128A is not capable of preventing the reference light 31 from irradiating the calibration region 120B. In the example shown in FIG. 14A, an optical white image (light intensity $I_W$) is obtained.

Figure 14B:
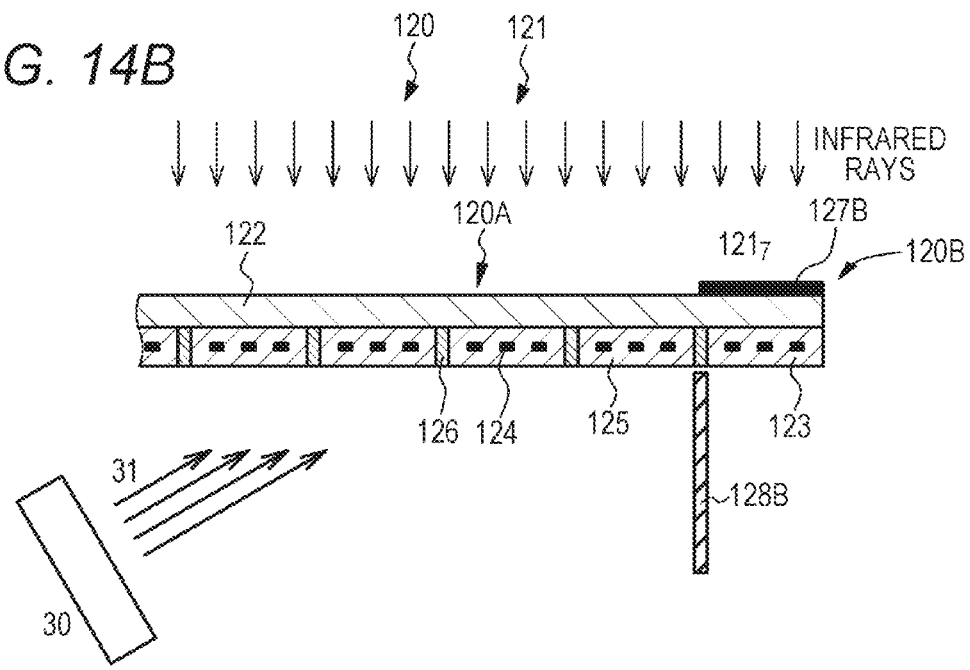

In the example shown in FIG. 14B, the calibration region 120B is formed with one or more infrared conversion devices $121_7$. The light blocking film 127B that prevents incidence of infrared rays is formed on a portion of the substrate 122 on the infrared incidence side, the portion corresponding to the infrared conversion device $121_7$. In a boundary region between the infrared detection region 120A and the calibration region 120B, the light blocking member 128B is provided in an appropriate manner so that the reference light 31 does not enter the calibration region 120B. The stop and the incidence angle of the reference light beams are set so that the reference light 31 does not enter the imaging device array unit 40 after reflected by the light blocking member 128B. In the example shown in FIG. 14B, an optical black image (light intensity $I_B$) is obtained.

Figure 15A:
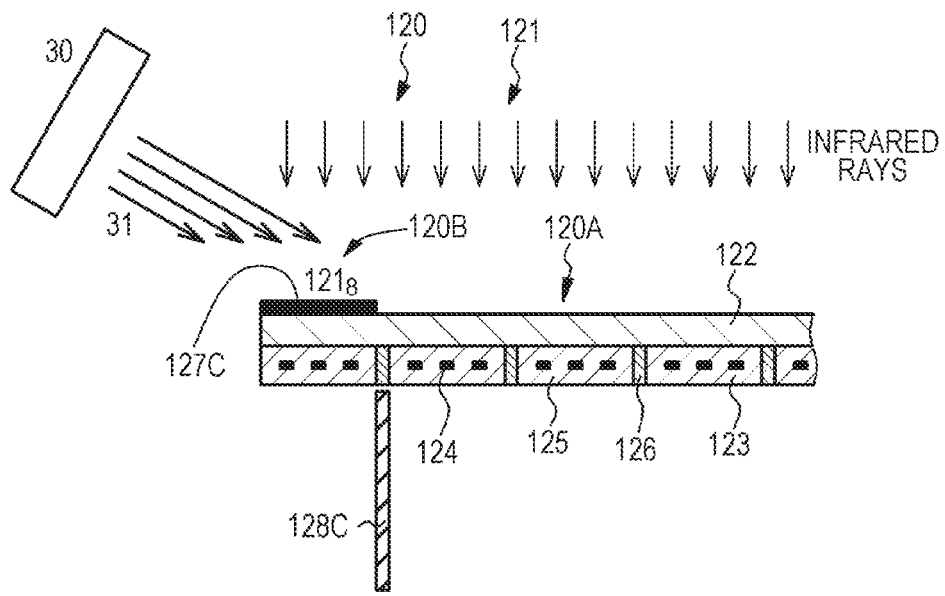
FIGS. 15A and 15B are conceptual diagrams of a modification of the imaging apparatus of Example 6.

In the example shown in FIG. 15A, the calibration region 120B is formed with one or more infrared conversion devices $121_8$. The light blocking film 127C that prevents incidence of infrared rays and the reference light 31 is formed on a portion of the substrate 122 on the infrared incidence side, the portion corresponding to the infrared conversion device $121_8$. In a boundary region between the infrared detection region 120A and the calibration region 120B, the light blocking member 128C is provided in an appropriate manner so that the scattering light or the like from the metal nanoparticles in the infrared detection region 120A does not enter the imaging device facing the calibration region 120B. In the example shown in FIG. 15A, an optical black image (light intensity $I_B$) is obtained.

Figure 15B:
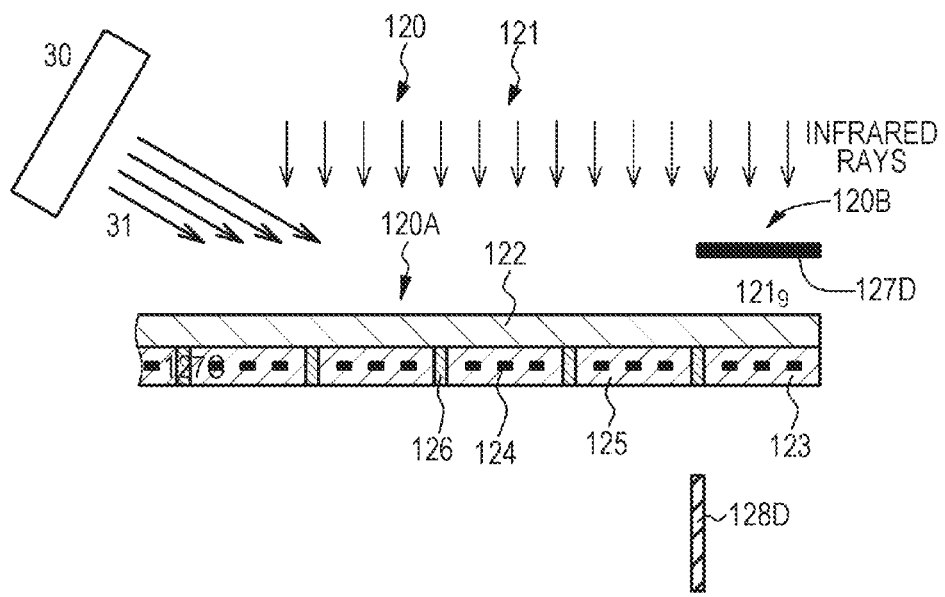

In the example shown in FIG. 15B, the calibration region 120B is formed with one or more infrared conversion devices $121_9$. The light blocking film 127D that prevents incidence of infrared rays is formed above a portion of the substrate 122 on the infrared incidence side, the portion corresponding to the infrared conversion device $121_9$. The light blocking film 127D is located at an appropriate distance from the substrate 122 so that the reference light 31 enters the calibration region 120B. In a boundary region between the infrared detection region 120A and the calibration region 120B, the light blocking member 128D is provided in an appropriate manner so that the scattering light or the like from the metal nanoparticles in the infrared detection region 120A does not enter the imaging device facing the calibration region 120B. The light blocking member 128D has an appropriate height and allows the transmitted reference light 31 to pass therethrough so that the reference light 31 having passed through the infrared detection region 120A does not enter the imaging device array unit 40 after reflected by the light blocking member 128D. In the example shown in FIG. 15B, an optical black image (light intensity $I_B$) is obtained.

EXAMPLE 7

Figure 16:
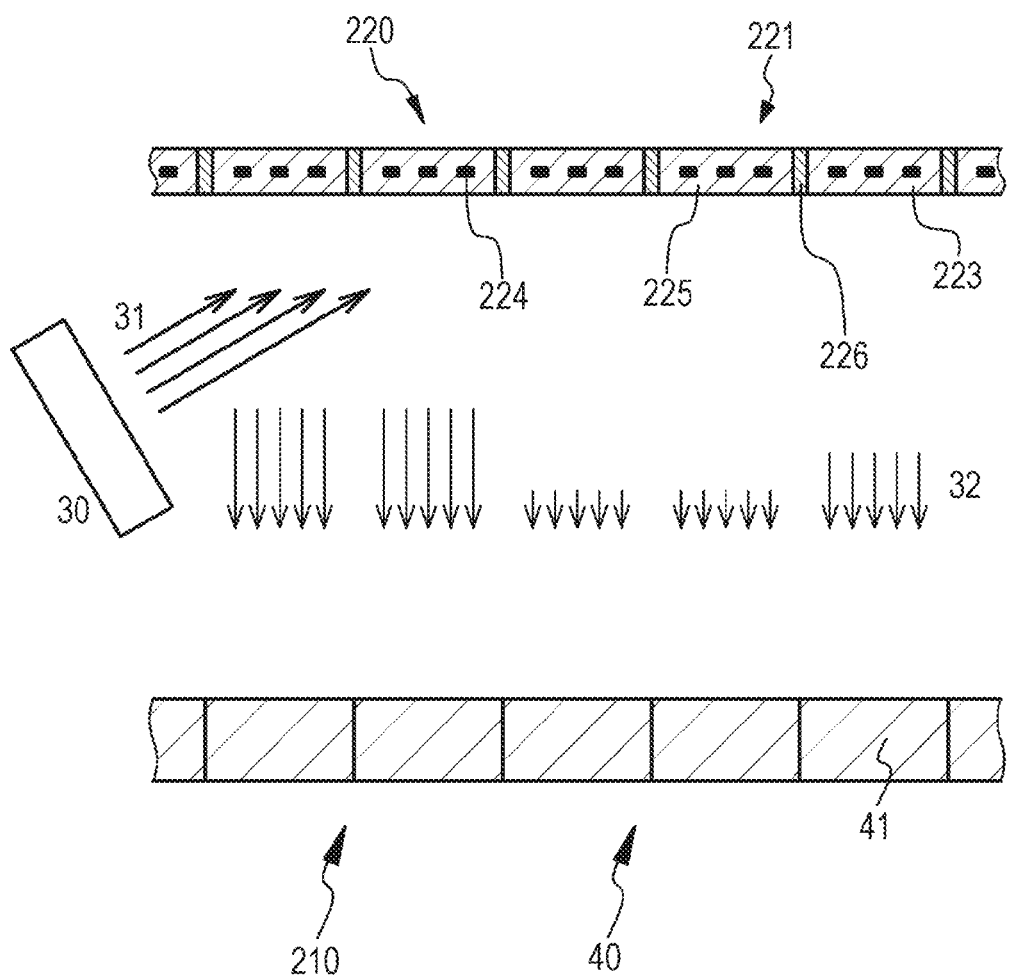
FIG. 16 is a conceptual diagram of an imaging apparatus of Example 7.

Example 7 relates to infrared conversion devices, imaging apparatuses, and imaging methods according to the second and fourth embodiments of the present disclosure. FIG. 16 is a conceptual diagram of an imaging apparatus of Example 7.

On the basis of the description of an infrared conversion device according to the second embodiment of the present disclosure, an infrared conversion device 221 of Example 7 includes a metal fine particle layer 223 that is formed with metal fine particles 224 and a dielectric material 225 that fills gaps between the metal fine particles 224 and 224 and absorbs incident infrared rays.

On the basis of the description of an infrared conversion device according to the fourth embodiment of the present disclosure, the infrared conversion device 221 of Example 7 is an infrared conversion device, or more particularly, is an infrared conversion device of a spatial light modulation type that detects infrared rays converted into visible light by detecting a change caused in the permittivity of the light receiving material 225 by infrared absorption as a change in the intensity of scattering light based on local plasmon resonance.

Further, on the basis of the description of an imaging apparatus according to the second embodiment or the fourth embodiment, an imaging apparatus 210 of Example 7 includes: (A) an infrared conversion device array unit 220 formed by arranging the infrared conversion devices 221 of Example 7 in a two-dimensional matrix fashion; (B) a light source 30 that emits reference light 31 to the infrared conversion device array unit 120; and (C) an imaging device array unit 40 that is located on the opposite side of the infrared conversion device array unit 220 from the infrared incidence side, or more specifically, is located at a distance from the infrared conversion device array unit 220.

The infrared conversion devices 221 of Example 7 may have substantially the same configuration and structure as the infrared conversion devices 121 of Examples 1 through 6, except that the substrate 122 is eliminated. The imaging apparatus of Example 7 may also have the same configuration and structure as any of the imaging apparatuses of Examples 1 through 6, except for the slight difference in the configuration and structure of the infrared conversion devices. Therefore, detailed explanation of them will not be repeated herein. Even without the substrate 122, the infrared conversion devices 221 of Example 7 can be manufactured by forming the separation regions 226 from a solid-state material having low thermal conductivity, and integrating the separation regions 226 with the dielectric material 225.

EXAMPLE 8

Figure 17:
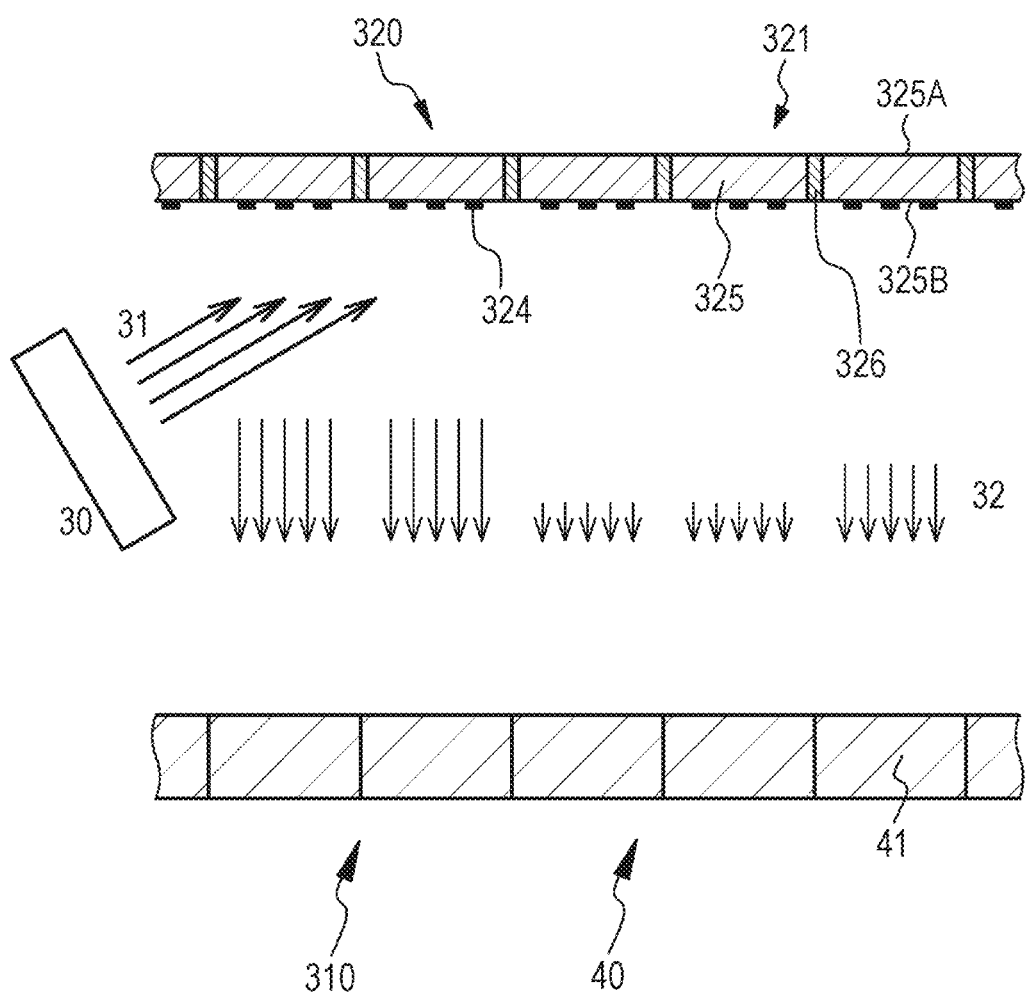
FIG. 17 is a conceptual diagram of an imaging apparatus of Example 8.
Figure 18A:
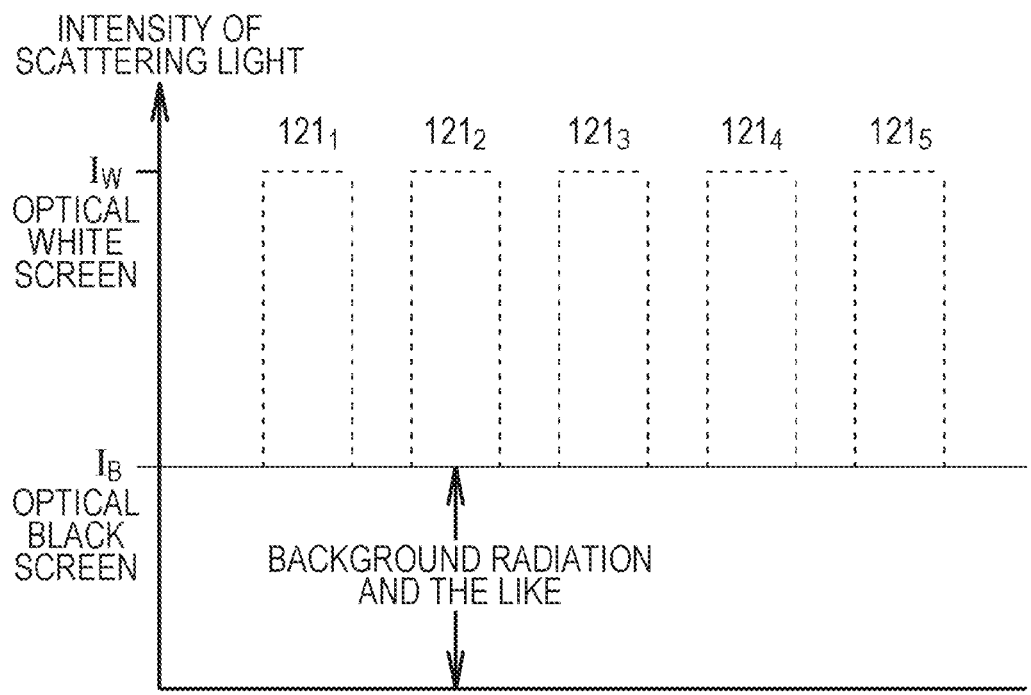
FIGS. 18A and 18B are diagrams for explaining the intensity of scattering light and the intensity of an output signal.
Figure 18B:
Figure 19A:
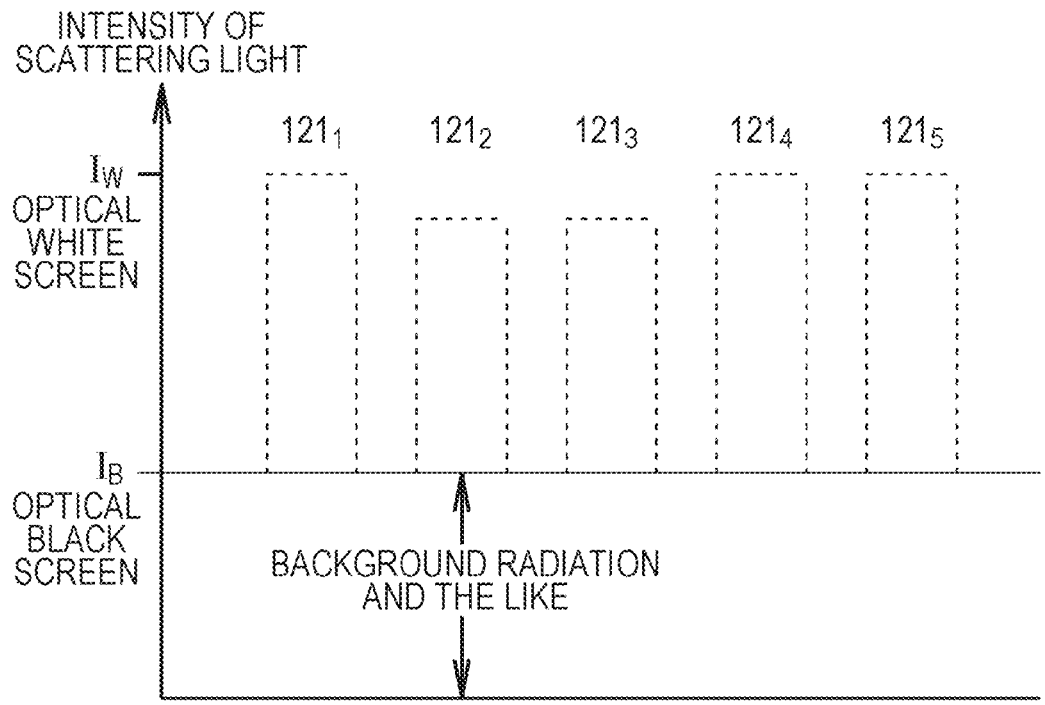
FIGS. 19A and 19B are diagrams for explaining the intensity of scattering light and the intensity of an output signal.
Figure 19B:
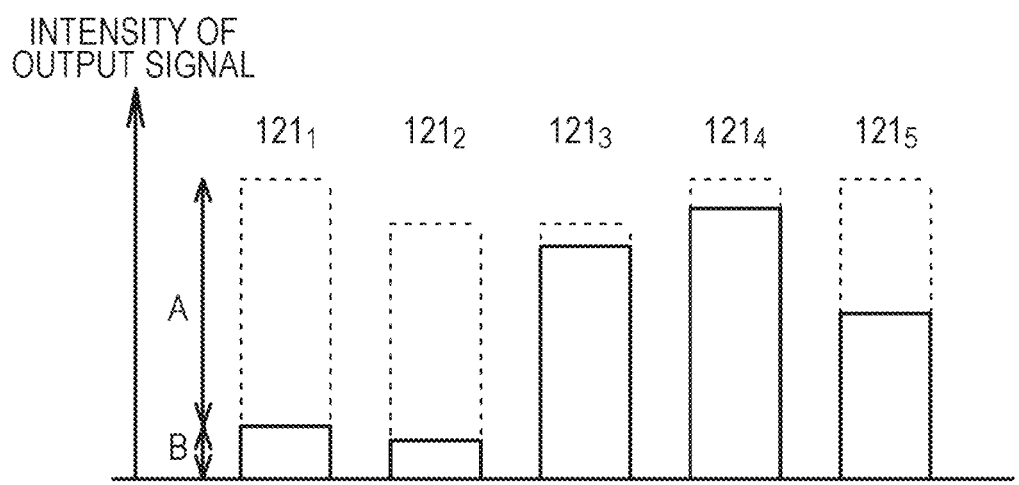

Example 8 relates to infrared conversion devices, imaging apparatuses, and imaging methods according to the third and fourth embodiments of the present disclosure. FIG. 17 is a conceptual diagram of an imaging apparatus of Example 8.

On the basis of the description of an infrared conversion device according to the third embodiment of the present disclosure, an infrared conversion device 321 of Example 8 includes: a dielectric film 325 that is formed with a dielectric material 325 and absorbs infrared rays entering from a first surface 325A; and metal fine particles 324 placed on a second surface 325B on the opposite side of the dielectric film 325 from the first surface 325A. The metal fine particles 324 may be partially buried in the second surface 325B of the dielectric film 325.

On the basis of the description of an infrared conversion device according to the fourth embodiment of the present disclosure, the infrared conversion device 321 of Example 8 is an infrared conversion device, or more particularly, is an infrared conversion device of a spatial light modulation type that detects infrared rays converted into visible light by detecting a change caused in the permittivity of the light receiving material 325 by infrared absorption as a change in the intensity of scattering light based on local plasmon resonance.

Further, on the basis of the description of an imaging apparatus according to the third embodiment or the fourth embodiment, an imaging apparatus 310 of Example 8 includes: (A) an infrared conversion device array unit 320 formed by arranging the infrared conversion devices 321 of Example 8 in a two-dimensional matrix fashion; (B) a light source 30 that emits reference light 31 to the infrared conversion device array unit 120; and (C) an imaging device array unit 40 that is located on the opposite side of the infrared conversion device array unit 320 from the infrared incidence side, or more specifically, is located at a distance from the infrared conversion device array unit 320.

The infrared conversion devices 321 of Example 8 may have substantially the same configuration and structure as the infrared conversion devices 121 of Examples 1 through 6, except that the substrate 122 is eliminated and the metal fine particles 324 are formed on the second surface 325B of the dielectric film 325. The imaging apparatus of Example 8 may also have the same configuration and structure as any of the imaging apparatuses of Examples 1 through 6, except for the slight differences in the configuration and structure of the infrared conversion devices. Therefore, detailed explanation of them will not be repeated herein. The infrared conversion device array unit 320 is preferably housed in a vacuum-sealed package, so as to avoid external disturbance due to heat. Even without the substrate 122, the infrared conversion devices 321 of Example 8 can be manufactured by forming the separation regions 326 from a solid-state material having low thermal conductivity, and integrating the separation regions 326 with the dielectric film 325.

Although the present disclosure has been described so far based on preferred examples, the present disclosure is not limited to those examples. Although the reference light continuously irradiates (illuminates) the entire infrared conversion device array unit in the above described examples, the present disclosure is not limited to that. The infrared conversion device array unit may be irradiated (illuminated) with pulse-like reference light. Also, the light source may be formed with a semiconductor laser device, and the infrared conversion device array unit may be irradiated (illuminated) with beams of reference light. With this structure, scattering light intensity may be sequentially read. So as to eliminate external disturbance due to heat, the infrared conversion device array unit of each of Examples 1 through 8 may be housed in a vacuum-sealed package, or the infrared conversion device array unit, the imaging devices, and the reference light source may be housed in a vacuum-sealed package.

When the imaging apparatus is powered on, calibration may be performed so that an optical white image is obtained by the imaging device array unit 40 as a result of irradiation of the infrared conversion device array unit 120, 220, or 320 with the reference light.

Also, conventional red imaging devices, green imaging devices, and blue imaging devices that capture images based on visible light, and infrared conversion devices may be arranged in a Bayer array, for example, so as to capture color images and thermal images. Alternatively, infrared conversion devices in a thinned state of some kind may be arranged in a two-dimensional array of conventional red imaging devices, green imaging devices, and blue imaging devices that capture images based on visible light, so as to capture color images and thermal images. Further, the infrared conversion device array unit may be located above the on-chip microlenses of a conventional imaging apparatus. In such a case, the infrared conversion device in the infrared conversion device array unit may be in a thinned state of some kind, and the infrared conversion device array unit may be formed with 10% of the pixels of a conventional imaging apparatus, for example, with the reference light being emitted from above as shown in FIG. 2. Also, a micro LED may be used as the light source, and an infrared conversion device may be irradiated with the reference light in a pinpointing manner.

Figure 20A:
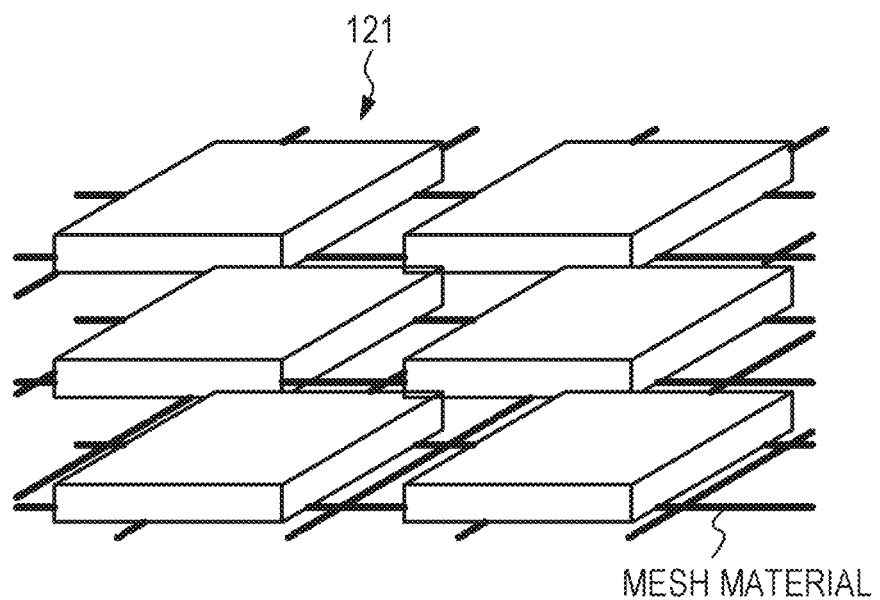
FIGS. 20A and 20B are conceptual diagrams each showing part of a modification of an infrared conversion device in an imaging apparatus of Example 1.
Figure 20B:
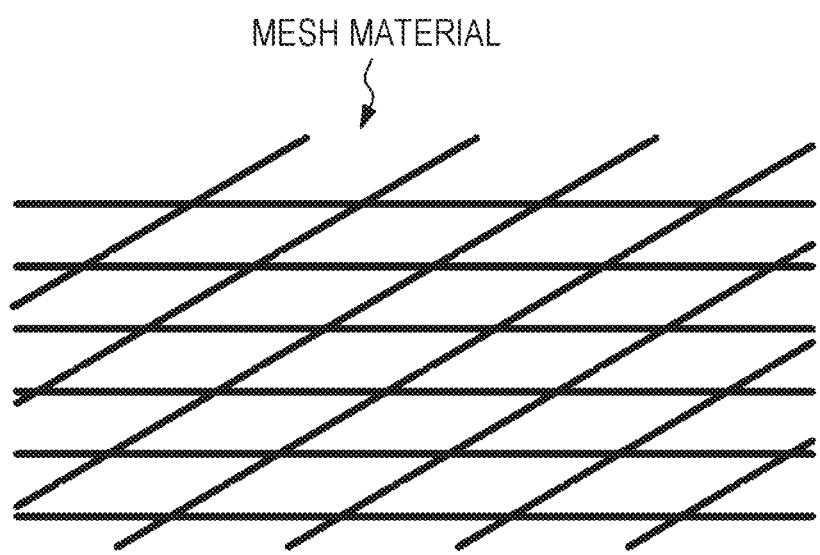
Figure 21A:
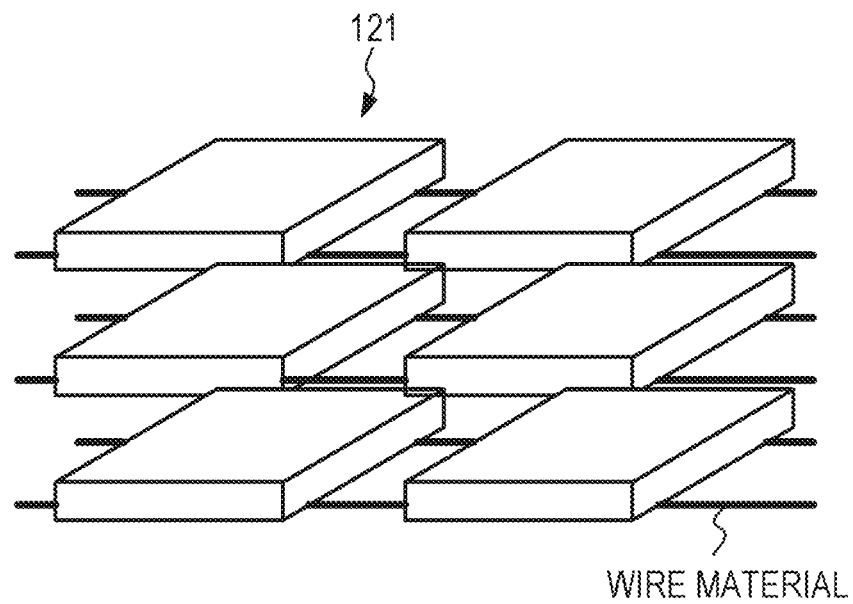
FIGS. 21A and 21B are conceptual diagrams each showing part of another modification of an infrared conversion device in an imaging apparatus of Example 1.
Figure 21B:
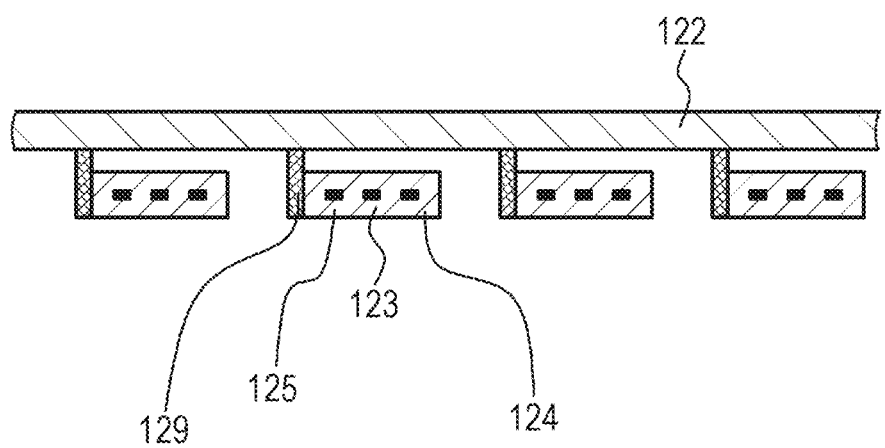

As shown in FIGS. 20A and 20B, which are conceptual diagrams of part of a modification of an infrared conversion device in an imaging apparatus of Example 1, the substrate 122 may be formed with a mesh material. As shown in FIG. 21A, the substrate 122 may also be formed with a wire material. The mesh material or the wire material is held by a holding unit in a region (not shown). In such cases, the thickness and the pitch of the mesh material or the wire material may be appropriately designed in accordance with the size of each infrared conversion device and the width of each separation region. The area of contact between the mesh material or the wire material with the metal fine particle layer is preferably as small as possible. As long as enough strength is maintained, the mesh material or the wire material can be made of any material in terms of optics. However, the thickness of the mesh material or the wire material is preferably as small as possible. Although the metal fine particle layer is formed on the substrate, metal fine particle layers may be formed above the substrate as shown in FIG. 21B, which is a conceptual diagram of part of another modification of an infrared conversion device in an imaging apparatus of Example 1. Specifically, the metal fine particle layers are held in positions above the substrate by holding members 129. Such a structure can be manufactured by a MEMS manufacturing technology.

The present disclosure can also be embodied in the structures described below.

[1] (Infrared Conversion Device: The First Embodiment)

An infrared conversion device including: a substrate; and a metal fine particle layer formed on the substrate, wherein the metal fine particle layer is formed with metal fine particles and a dielectric material that fills gaps between the metal fine particles and absorbs incident infrared rays.

[2] (Infrared Conversion Device: The Second Embodiment)

An infrared conversion device including: a metal fine particle layer formed with metal fine particles and a dielectric material that fills gaps between the metal fine particles and absorbs incident infrared rays.

[3] (Infrared Conversion Device: The Third Embodiment)

An infrared conversion device including:

a dielectric film that is formed with a dielectric material and absorbs infrared rays entering from a first surface thereof; and metal fine particles placed on a second surface of the dielectric film, the second surface being on the opposite side from the first surface.

[4] (Infrared Conversion Device: The Fourth Embodiment)

An infrared conversion device that detects infrared rays converted into visible light by detecting a change caused in the permittivity of a light receiving material by infrared absorption as a change in the intensity of scattering light based on local plasmon resonance.

[5] The infrared conversion device of any one of [1] through [3], wherein scattering light is generated based on local plasmon resonance that is caused in the metal fine particles by irradiation of the metal fine particles with reference light.

[6] The infrared conversion device of [5], wherein the local plasmon resonance state in the metal fine particles is changed due to a change in the permittivity of the dielectric material, the change in the permittivity of the dielectric material being caused by infrared absorption.

[7] The infrared conversion device of [6], wherein the intensity of the scattering light becomes lower as the local plasmon resonance state is changed.

[8] The infrared conversion device of any one of [5] through [7], wherein the reference light is visible light, and the frequency of the scattering light is equal to the frequency of the reference light.

[9] The infrared conversion device of [8], wherein the wavelength of the reference light is variable.

[10] The infrared conversion device of any one of [1] through [9], wherein the metal fine particles are regularly arranged.

[11] (Imaging Apparatus: The First Embodiment)

An imaging apparatus including:

(A) an infrared conversion device array unit formed by arranging infrared conversion devices in a two-dimensional matrix fashion, each of the infrared conversion devices including a substrate and a metal fine particle layer formed on the substrate, the metal fine particle layer including metal fine particles and a dielectric material that fills gaps between the metal fine particles and absorbs incident infrared rays;

(B) a light source that emits reference light to the infrared conversion device array unit; and (C) an imaging device array unit located on the opposite side of the infrared conversion device array unit from the infrared incidence side.

[12] (Imaging Apparatus: The Second Embodiment)

An imaging apparatus including:

(A) an infrared conversion device array unit formed by arranging infrared conversion devices in a two-dimensional matrix fashion, each of the infrared conversion devices including a metal fine particle layer, the metal fine particle layer including metal fine particles and a dielectric material that fills gaps between the metal fine particles and absorbs incident infrared rays;

(B) a light source that emits reference light to the infrared conversion device array unit; and (C) an imaging device array unit located on the opposite side of the infrared conversion device array unit from the infrared incidence side.

[13] (Imaging Apparatus: The Third Embodiment)

An imaging apparatus including:

(A) an infrared conversion device array unit formed by arranging infrared conversion devices in a two-dimensional matrix fashion, each of the infrared conversion devices including a dielectric film and metal fine particles, the dielectric film being formed with a dielectric material and absorbing infrared rays entering from a first surface thereof, the metal fine particles being placed on a second surface of the dielectric film, the second surface being on the opposite side from the first surface;

(B) a light source that emits reference light to the infrared conversion device array unit; and (C) an imaging device array unit located on the opposite side of the infrared conversion device array unit from the infrared incidence side.

[14] (Imaging Apparatus: The Fourth Embodiment)

An imaging apparatus including:

(A) an infrared conversion device array unit formed by arranging infrared conversion devices in a two-dimensional matrix fashion, each of the infrared conversion devices detecting infrared rays converted into visible light by detecting a change caused in the permittivity of a light receiving material by infrared absorption as a change in the intensity of scattering light based on local plasmon resonance;

(B) a light source that emits reference light to the infrared conversion device array unit; and (C) an imaging device array unit located on the opposite side of the infrared conversion device array unit from the infrared incidence side.

[15] The imaging apparatus of any one of [11] through [13], wherein scattering light is generated based on local plasmon resonance that is caused in the metal fine particles by irradiation of the metal fine particles with the reference light.

[16] The imaging apparatus of [15], wherein the local plasmon resonance state in the metal fine particles is changed due to a change in the permittivity of the dielectric material, the change in the permittivity of the dielectric material being caused by infrared absorption.

[17] The imaging apparatus of [15] or [16], wherein the intensity of the scattering light becomes lower as the local plasmon resonance state is changed.

[18] The imaging apparatus of any one of [11] through [17], wherein the reference light is visible light, and the frequency of the scattering light is equal to the frequency of the reference light.

[19] The imaging apparatus of [18], wherein the wavelength of the reference light is variable.

[20] The imaging apparatus of any one of [11] through [19], wherein a wavelength selector that selects a wavelength of the reference light is provided between the light source and the metal fine particle layer.

[21] The imaging apparatus of any one of [11] through [20], wherein the metal fine particles are regularly arranged.

[22] The imaging apparatus of any one of [11] through [21], further including a light blocking mechanism for calibrating detection of the intensity of scattering light.

[23] The imaging apparatus of [22], wherein the light blocking mechanism is formed with a shutter mechanism that controls infrared rays incident on the dielectric material

[24] The imaging apparatus of any one of [11] through [23], wherein the infrared conversion device array unit includes an infrared detection region and a calibration region for calibrating detection of the intensity of scattering light.

[25] The imaging apparatus of [24], wherein a light blocking film for preventing incidence of infrared rays is formed in the calibration region, and a light blocking member is placed in a boundary region between the infrared detection region and the calibration region.

[26] The imaging apparatus of any one of [11] through [25], wherein a reflective member that reflects scattering light toward the metal fine particle layer is provided on the infrared incidence side of each of the infrared conversion devices.

[27] The imaging apparatus of any one of [11] through [26], wherein a microlens is provided on the infrared incidence side of each of the infrared conversion devices.

[28] (Imaging Method: The First Embodiment)
An imaging method using an imaging apparatus including:
(A) an infrared conversion device array unit formed by arranging infrared conversion devices in a two-dimensional matrix fashion, each of the infrared conversion devices including a substrate and a metal fine particle layer formed on the substrate, the metal fine particle layer including metal fine particles and a dielectric material that fills gaps between the metal fine particles and absorbs incident infrared rays;
(B) a light source that emits reference light to the infrared conversion device array unit; and
(C) an imaging device array unit located on the opposite side of the infrared conversion device array unit from the infrared incidence side,
the imaging method including detecting a decrease in the intensity of scattering light due to a change in a local plasmon resonance state formed in the metal fine particles by irradiation of the metal fine particles with the reference light, since the permittivity of the dielectric material changes due to infrared absorption, the detecting being performed by the imaging device array unit.

[29] (Imaging Method: The Second Embodiment)
An imaging method using an imaging apparatus including:
(A) an infrared conversion device array unit formed by arranging infrared conversion devices in a two-dimensional matrix fashion, each of the infrared conversion devices being formed with a metal fine particle layer including metal fine particles and a dielectric material that fills gaps between the metal fine particles and absorbs incident infrared rays;
(B) a light source that emits reference light to the infrared conversion device array unit; and
(C) an imaging device array unit located on the opposite side of the infrared conversion device array unit from the infrared incidence side,
the imaging method including detecting a decrease in the intensity of scattering light due to a change in a local plasmon resonance state formed in the metal fine particles by irradiation of the metal fine particles with the reference light, since the permittivity of the dielectric material changes due to infrared absorption, the detecting being performed by the imaging device array unit.

[30] (Imaging Method: The Third Embodiment)
An imaging method using an imaging apparatus including:
(A) an infrared conversion device array unit formed by arranging infrared conversion devices in a two-dimensional matrix fashion, each of the infrared conversion devices including a dielectric film and metal fine particles, the dielectric film being formed with a dielectric material and absorbing infrared rays entering from a first surface thereof, the metal fine particles being placed on a second surface of the dielectric film, the second surface being on the opposite side from the first surface;
(B) a light source that emits reference light to the infrared conversion device array unit; and
(C) an imaging device array unit located on the opposite side of the infrared conversion device array unit from the infrared incidence side,
the imaging method including detecting a decrease in the intensity of scattering light due to a change in a local plasmon resonance state formed in the metal fine particles by irradiation of the metal fine particles with the reference light, since the permittivity of the dielectric material changes due to infrared absorption, the detecting being performed by the imaging device array unit.

[31] (Imaging Method: The Fourth Embodiment)
An imaging method using an imaging apparatus including:
(A) an infrared conversion device array unit formed by arranging infrared conversion devices in a two-dimensional matrix fashion, each of the infrared conversion devices detecting infrared rays converted into visible light by detecting a change caused in the permittivity of a light receiving material due to infrared absorption as a change in the intensity of scattering light based on local plasmon resonance;
(B) a light source that emits reference light to the infrared conversion device array unit; and
(C) an imaging device array unit located on the opposite side of the infrared conversion device array unit from the infrared incidence side,
the imaging method including detecting a decrease in the intensity of the scattering light due to a change in a local plasmon resonance state formed in the light receiving material caused by irradiation of the light receiving material with the reference light, since the permittivity of the light receiving material changes due to infrared absorption, the detecting being performed by the imaging device array unit.

REFERENCE SIGNS LIST 110, 210, 310 imaging apparatus
120, 220, 320 Infrared conversion device array unit 120A Infrared detection region
120B Calibration region
121, 121$_1$, 121$_2$, 121$_3$, 121$_4$, 121$_5$, 121$_6$, 121$_7$, 121$_8$, 121$_9$, 221, 321 Infrared conversion device
122 Substrate
122A First surface of substrate
122B Second surface of substrate
123 Metal fine particle layer
124, 224, 324 Metal fine particle
125, 225, 325 Dielectric material (light receiving material)
325 Dielectric film
325A First surface of dielectric film
325B Second surface of dielectric film
126, 226, 326 Separation region
127A, 127B, 127C, 127D Light blocking film
128A, 128B, 128C, 128D Light blocking member
129 Holding member
30 Light source
31 Reference light
32 Scattering light
40 Imaging device array unit
41 Imaging device
51 Microlens
52 Reflective member
53 Base
54 Light reflection coating
61 Shutter mechanism
62 Second shutter mechanism

The invention claimed is:

1. An infrared conversion device comprising:
a substrate; and
a metal fine particle layer formed on the substrate,
wherein the metal fine particle layer is formed with metal fine particles and a dielectric material that fills a gap between the metal fine particles and absorbs an incident infrared ray, and
wherein scattering light is generated based on local plasmon resonance, the local plasmon resonance being caused in the metal fine particles by irradiation of the metal fine particles with reference light.

2. The infrared conversion device according to claim 1, wherein the local plasmon resonance state in the metal fine particles is changed due to a change in permittivity of the dielectric material, the change in the permittivity of the dielectric material being caused by infrared absorption.

3. The infrared conversion device according to claim 2, wherein intensity of the scattering light becomes lower as the local plasmon resonance state is changed.

4. The infrared conversion device according to claim 1, wherein the reference light is visible light, and frequency of the scattering light is equal to frequency of the reference light.

5. The infrared conversion device according to claim 4, wherein wavelength of the reference light is variable.

6. The infrared conversion device according to claim 1, wherein the metal fine particles are regularly arranged.

7. An infrared conversion device configured to detect an infrared ray converted into visible light by detecting a change caused in permittivity of a light receiving material by infrared absorption as a change in intensity of scattering light based on local plasmon resonance.

8. An imaging apparatus comprising:
(A) an infrared conversion device array unit including infrared conversion devices arranged in a two-dimensional matrix fashion, each of the infrared conversion devices including a substrate and a metal fine particle layer formed on the substrate, the metal fine particle layer including metal fine particles and a dielectric material that fills a gap between the metal fine particles and absorbs an incident infrared ray;
(B) a light source configured to emit reference light to the infrared conversion device array unit; and
(C) an imaging device array unit located on the opposite side of the infrared conversion device array unit from an infrared incidence side,
wherein scattering light is generated based on local plasmon resonance, the local plasmon resonance being caused in the metal fine particles by irradiation of the metal fine particles with the reference light.

9. The imaging apparatus according to claim 8, wherein the local plasmon resonance state in the metal fine particles is changed due to a change in permittivity of the dielectric material, the change in the permittivity of the dielectric material being caused by infrared absorption.

10. An imaging apparatus comprising:
(A) an infrared conversion device array unit including infrared conversion devices arranged in a two-dimensional matrix fashion, each of the infrared conversion devices detecting an infrared ray converted into visible light by detecting a change caused in permittivity of a light receiving material by infrared absorption as a change in intensity of scattering light based on local plasmon resonance;
(B) a light source configured to emit reference light to the infrared conversion device array unit; and
(C) an imaging device array unit located on the opposite side of the infrared conversion device array unit from an infrared incidence side.

11. An imaging method using an imaging apparatus including (A) an infrared conversion device array unit formed by arranging infrared conversion devices in a two-dimensional matrix fashion, each of the infrared conversion devices including a substrate and a metal fine particle layer formed on the substrate, the metal fine particle layer including metal fine particles and a dielectric material that fills a gap between the metal fine particles and absorbs an incident infrared ray; (B) a light source configured to emit reference light to the infrared conversion device array unit; and (C) an imaging device array unit located on the opposite side of the infrared conversion device array unit from an infrared incidence side, the imaging method comprising:
detecting a decrease in intensity of scattering light due to a change in a local plasmon resonance state formed in the metal fine particles by irradiation of the metal fine particles with the reference light, since permittivity of the dielectric material changes due to infrared absorption, the detecting being performed by the imaging device array unit.

12. An imaging method using an imaging apparatus including (A) an infrared conversion device array unit formed by arranging infrared conversion devices in a two-dimensional matrix fashion, each of the infrared conversion devices being formed with a metal fine particle layer including metal fine particles and a dielectric material that fills a gap between the metal fine particles and absorbs an incident infrared ray; (B) a light source configured to emit reference light to the infrared conversion device array unit; and (C) an imaging device array unit located on the opposite side of the infrared conversion device array unit from an infrared incidence side, the imaging method comprising:
detecting a decrease in intensity of scattering light due to a change in a local plasmon resonance state formed in the metal fine particles by irradiation of the metal fine particles with the reference light, since permittivity of the dielectric material changes due to infrared absorption, the detecting being performed by the imaging device array unit.

13. An imaging method using an imaging apparatus including (A) an infrared conversion device array unit formed by arranging infrared conversion devices in a two-dimensional matrix fashion, each of the infrared conversion devices including a dielectric film and a plurality of metal fine particles, the dielectric film being formed with a dielectric material and absorbing an infrared ray entering from a first surface thereof, the metal fine particles being placed on a second surface of the dielectric film, the second surface being on the opposite side from the first surface; (B) a light source configured to emit reference light to the infrared conversion device array unit; and (C) an imaging device array unit located on the opposite side of the infrared conversion device array unit from an infrared incidence side, the imaging method comprising:

detecting a decrease in intensity of scattering light due to a change in a local plasmon resonance state formed in the metal fine particles by irradiation of the metal fine particles with the reference light, since permittivity of the dielectric material changes due to infrared absorption, the detecting being performed by the imaging device array unit.

14. An imaging method using an imaging apparatus including (A) an infrared conversion device array unit formed by arranging infrared conversion devices in a two-dimensional matrix fashion, each of the infrared conversion devices detecting an infrared ray converted into visible light by detecting a change caused in permittivity of a light receiving material due to infrared absorption as a change in intensity of scattering light based on local plasmon resonance; (B) a light source configured to emit reference light to the infrared conversion device array unit; and (C) an imaging device array unit located on the opposite side of the infrared conversion device array unit from an infrared incidence side, the imaging method comprising:

detecting a decrease in the intensity of the scattering light due to a change in a local plasmon resonance state formed in the light receiving material by irradiation of the light receiving material with the reference light, since the permittivity of the light receiving material changes due to infrared absorption, the detecting being performed by the imaging device array unit.

* * * * *